United States Patent

Sugaya et al.

[11] Patent Number: 5,684,569
[45] Date of Patent: Nov. 4, 1997

[54] POSITION DETECTING APPARATUS AND PROJECTION EXPOSURE APPARATUS

[75] Inventors: Ayako Sugaya, Kawasaki; Masahiro Nakagawa, Yokohama, both of Japan

[73] Assignee: Nikon Corporation, Japan

[21] Appl. No.: 360,523

[22] Filed: Dec. 21, 1994

[30] Foreign Application Priority Data

Dec. 22, 1993 [JP] Japan ............................ 5-3233514

[51] Int. Cl.$^6$ .......................... H01L 27/027; G03B 27/72
[52] U.S. Cl. .......................... 355/71; 355/53; 355/55; 355/67; 250/548; 396/120
[58] Field of Search .......................... 355/52, 53, 55, 355/71, 77, 67; 250/548; 396/118, 119, 120, 121

[56] References Cited

U.S. PATENT DOCUMENTS

| | | | |
|---|---|---|---|
| 4,862,008 | 8/1989 | Oshida et al. | 250/548 |
| 4,937,619 | 6/1990 | Fukuda et al. | 355/53 |
| 4,965,630 | 10/1990 | Kato et al. | 355/52 |
| 5,144,362 | 9/1992 | Kamon et al. | 355/53 |
| 5,160,849 | 11/1992 | Ota et al. | 250/548 |
| 5,182,455 | 1/1993 | Muraki | 250/548 |
| 5,214,489 | 5/1993 | Mizutani et al. | 356/363 |
| 5,231,467 | 7/1993 | Takeuchi et al. | 356/356 |
| 5,311,362 | 5/1994 | Matsumoto et al. | 359/738 |
| 5,337,097 | 8/1994 | Suzuki et al. | 353/101 |
| 5,347,356 | 9/1994 | Ota et al. | 356/363 |
| 5,420,436 | 5/1995 | Seya et al. | 250/492.1 |
| 5,489,966 | 2/1996 | Kawashima et al. | 355/43 |
| 5,489,986 | 2/1996 | Magome et al. | 356/401 |

FOREIGN PATENT DOCUMENTS 4-273246(A)  9/1992  Japan.

Primary Examiner—Arthur T. Grimley
Assistant Examiner—Herbert Kerner
Attorney, Agent, or Firm—Pennie & Edmonds LLP

[57] ABSTRACT

In a position detecting apparatus, according to this invention, a convexly and concavely patterned wafer mark is imaged on an image pickup surface via an imaging optical system, and the image on the image pickup surface is detected. The position detecting apparatus defocuses the average surface of the wafer mark from the optimum focusing surface depending on the pitch and difference in level of the wafer mark, etc., in the direction of the optical axis of the imaging optical system, and varies an illumination σ value definded as the ratio of the numerical aperture of the illumination optical system and the numerical aperture of the imaging optical system. Then the position detecting apparatus provides lights from the wafer mark to the image pickup surface with rotation-symmetric wave aberration to allow the resulting image to have the highest contrast for positional detection.

18 Claims, 21 Drawing Sheets

Z = Zo

Z = 0

Z = Zo'

POSITION DETECTING APPARATUS AND PROJECTION EXPOSURE APPARATUS

BACKGROUND OF THE INVENTION

1. Field of the Invention

The present invention relates to a position detecting apparatus and a projection exposure apparatus, and particularly to a position detecting apparatus which is suitable for use in an alignment system for photoelectric detection of the position of an alignment mark formed on a photosensitive substrate, for projection exposure apparatuses for manufacturing semiconductor devices, liquid crystal displays, etc.

2. Related Background Art

In projection exposure apparatuses which are used in the photolithographic process for the manufacture of semiconductor devices, etc., the pattern of a photomask or reticle (reticle used for explanation hereunder) is exposed and transferred to a photoresist-applied wafer (or glass plate). A multi-layer circuit pattern is usually formed on a wafer. In order to increase the yield of the semiconductor devices or the like, it is necessary to accomplish a high alignment precision, when the image of the pattern of a reticle to be exposed is aligned with the tip patterns already formed on the respective areas on the wafer. For this reason, the position of the wafer mark, which is an alignment mark provided in each shot area on the wafer, must be detected by an alignment system with high precision.

Illustrative examples of conventional alignment systems used an image processing method disclosed in Japanese Patent Application Disclosure HEI 4-65603 and Japanese Patent Application Disclosure HEI 4-273246. According to this image processing method, wafer marks formed on the wafer are uniformly illuminated, an enlarged image of each wafer mark is formed through the object lens of the microscope, and the enlarged image is picked up with an image pickup device such as a two-dimensional CCD, and the position of the wafer mark is detected, analyzing the image pickup signals.

FIG. 1 shows main portions of a projection exposure apparatus equipped with a conventional image processing type alignment system, wherein the patterned area PA of a reticle R mounted on a reticle stage 1 is illuminated with light for exposure from an illumination optical system (not shown), and the patterns on the patterned area PA are exposed and transferred to the respective shot areas on the wafer W held on a wafer stage 2. The Z-axis is defined to be parallel to the optical axis of the projection optical system PL, the X-axis is defined to be parallel to the plane of FIG. 1 in the two-dimensional plate perpendicular to the Z-axis, and the Y-axis is defined to be perpendicular to the plane of FIG. 1. Each shot area on the wafer W is provided with a wafer mark WM; as is shown in FIG. 2, the wafer marks are convex and concave patterns formed on the surface of the wafer, with a certain pitch along the X direction. Though not shown, convex and concave patterns with a certain pitch in the Y direction are also formed on the surface of the wafer W.

Returning to FIG. 1, there is arranged image processing type alignment system in a manner of off-axis along the side of an projection optical system PL. In this type alignment system, illumination light from a halogen lamp 3 is converged at one end of optical fibers 4, and the illumination light AL outputting from the other end of the optical fibers 4 travels via a collimator lens 5, a half prism 6, an object lens 7 and a total reflection prism 8, and illuminate the wafer mark WM and its surrounding area. Reflected light from the wafer W travels back to the half prism 6 via the total reflection prism 8 and the objection lens 7. The reflected light from the half prism 6 travels through an imaging lens 11 to form an image of the wafer mark WM on the wafer W, on an index plate 12.

On the index plate 12, there is formed an index mark for defining the positions in the conjugate directions with the X direction and the Y direction. The transmitted light from index plate 12 reaches a half prism 15 via a first relay lens 13, and a second relay lens 14. The reflected light from the half prism 15 forms an image of the wafer mark WM and an image of the index mark on the image pickup surface of a two-dimensional image pickup device 16 for the X-axis. The image pickup device 16 for the X-axis comprises a charge-coupled device (CCD). Whereas the transmitted light from the half prism 15 forms an image of the wafer mark WM and an image of the index mark on the image pickup surface of a two-dimensional image pickup device 17 for the Y-axis. The image pickup device 17 for the Y-axis comprises a CCD. Here, the scanning direction of the image pickup device 16 is set in the conjugate direction with the X-axis, the scanning direction of the image pickup device 17 is set in the conjugate direction with Y-axis. Image pickup signals read from the two-dimensional image pickup devices 16 and 17 are each fed to a signal processing system 18. At the signal processing system 18, the position of the wafer mark WM for the X-axis on the wafer W is detected using the image pickup signals from the two-dimensional image pickup device 16, when the index mark is the reference. And the position of the wafer mark WM for the Y-axis on the wafer W is detected, using the image pickup signals from the two-dimensional image pickup device 17, when the index mark is the reference.

In the alignment system shown in FIG. 1, the so-called coherence factor, which is the value of ratio of the numerical aperture of illumination optical systems 5, 7 to the numerical aperture of the imaging optical systems 7, 11 (referred to as "illumination σ value" hereunder), is maximized for minimizing the noise signal components from rough sections of the wafer surface and to detect signals from edge portions of the wafer mark WM satisfactorily. In addition, since a photoresist is applied on the surface of the wafer W to diminish the influence due to film interference attributable to the photoresist, it is attempted to widen the wave length band of illumination light. In this way, a conventional high precision projection optical apparatus being free from the influence of roughness of the wafer surface and the photoresist, is obtained.

SUMMARY OF THE INVENTION

It is an object of the present invention to provide a projection optical apparatus which is capable of picking up high-contrast images even if step level of mark is low, and accomplishing the positional detection with high precision.

The position detecting apparatus according to the present invention comprises, for example, as is shown in FIG. 3, imaging optical systems (3, 4, 29, 5, 7) which illuminate marks (WM) for positional detection formed on the object of interest (W), imaging optical systems (7, 11, 13, 14) for converging light from the mark for positional detection and forming an image of the mark for positional detection, and pickup means (16) for picking up an image of the mark for positional detection, detects the displacement in a certain direction of measurement (X direction) of the mark for positional detection on the object of interest (W) based on pickup signals from the pickup means, and detects the position of the object of interest (W) based on the positional displacement. And to increase contrast of the pickup signals from the pickup means (16), the position detecting apparatus further comprises wave aberration providing means for providing light beams to be detected from the mark (WM) for positional detection with wave aberration being symmetrical along the direction of measurement with respect to the optical axis (AX) of the imaging optical system.

Here, an example of the wave aberration-providing means is defocusing means for defocusing the image of the mark (WM) for positional detection, and the image of the mark (WM) is formed on the image pickup means (16) by the imaging optical system.

Another example of the wave aberration-providing means is an optical member located near the pupil surface of the imaging optical system and the optical member provides the imaging beams with a predetermined phase difference corresponding to the passing area on the pupil surface.

It is preferred that the wave aberration-providing means is constructed so as to provide the beams to be detected from the mark (WM) for positional detection, with variable wave aberration, and σ value-varying means (27, 30) for varying the illumination σ value defined as the ratio of the numerical aperture of the illumination optical system and the numerical aperture of the imaging optical system corresponding to the amount of wave aberration is arranged on the optical path from the light source of the illumination optical system to the imaging surface of the imaging optical system to vary the illumination σ value, using the σ value-varying means (27, 30).

An explanation will now be given regarding the mechanism of the present invention. First, suppose that the image, which is obtained by picking up a rectangular wave lattice comprising a plain and dark bright pattern, is the image consisting of the dark 19A and the light 19B as shown in FIG. 4. The direction of arrangement of this image is defined as X direction, and the displacement of the rectangular wave lattice in the direction of the optical axis from the optimum focusing surface of the imaging optical system is expressed as Z. Here, the intensity distribution of the image of FIG. 4 in the X direction is as shown in FIG. 5. Regarding images of plain rectangular wave lattices, it is known that the difference $\Delta I$ ($=I_{max}-I_{min}$) between the maximum $I_{max}$ and the minimum $I_{min}$ of the intensity distribution $I(X)$ becomes the greatest when the plain rectangular wave lattice is on the optimum focusing surface of the imaging optical system (Z=0).

However, the mark for positional detection to be measured according to the present invention is a phase lattice having a convex and concave pattern. With regard to such phase lattices, the difference $\Delta I$ between the maximum and the minimum of the intensity distribution $I(X)$ of the image is not always the greatest when the phase lattice is at the optimum focusing position. For simplicity of explanation, suppose that, the mark WM for positional is a phase lattice, the image of the mark WM is projected on a pickup surface 33 (FIG. 6) by an imaging optical system 32, and the displacement of the mark WM in the direction of the optical axis of the imaging optical system 32 from a surface conjugating with the pickup surface 33, or the optimum focusing surface 34, is expressed as Z.

Here, if the mark WM is displaced by Z from the optimum focusing surface 34, then rotation-symmetric wave aberration is created with respect to the optical axis AX, depending on the displacement (defocusing amount) Z. Therefore, hereunder, to illustrate wave aberration along the direction of measurement according to the present invention, and symmetric with respect to the optical axis AX of the imaging optical system 32, the defocusing amount Z is varied to provide the light to be detected from the mark WM with wave aberration $\Delta W$ which is rotation-symmetric about the optical axis AX of the imaging optical system 32. In other words, hereunder the wave aberration $\Delta W$ is treated as a function of the defocusing amount Z.

Further, assuming that the illumination light is coherent, and the imaging optical system 32 converges only zero order light and ±1st order light, the pitch in the direction of measurement, or the X direction, the difference in level, and the duty ratio of the mark WM are defined as p, $\theta(\lambda)$, and 0.5, respectively, the amplitude $u(X)$ of the image formed at the position X on the pickup surface 33 by the imaging optical system 32 may be expressed as follows:

$$U(X)=(\tfrac{1}{2})+(2/\pi)\cos\{(2\pi X/p)\exp(i\Delta W)+\exp(i\theta(\lambda))[(\tfrac{1}{2})-(2/\pi)\cos\{(2\pi X/p)\exp(i\Delta W)]\quad(1)$$

The intensity distribution $I(X)$ of the image at X values 0, p/4 and p/2 on the pickup surface 33 of FIG. 6 may be expressed as follows:

$$I(0) = |u(0)|^2 \quad (2)$$
$$= \{1/2)+(8/\pi^2)\} + \{(1/2)-(8/\pi^2)\}\cos(\theta(\lambda)) + (4/\pi)\sin(\theta(\lambda))\sin\Delta W$$

$$I(p/4) = (1/2)\{1+\cos(\theta(\lambda))\} \quad (3)$$

$$I(p/2) = \{(1/2)+(8/\pi^2)\} + \{(1/2)-(8/\pi^2)\}\cos(\theta(\lambda)) - \quad (4)$$
$$(4/\pi)\sin(\theta(\lambda))\sin\Delta W$$

As is apparent from Equations (2)–(4), the intensity distribution $I(X)$ of the image depends on the amount of the wave aberration $\Delta W$. Further, since the wave aberration $\Delta W$ varies in response to the amount of defocusing Z from the optimum focusing surface 34 of the mark WM for positional detection, the intensity distributions $I(X)$ observed when the defocusing amount Z is varied to $Z_0$, 0 or $-Z_0$ are shown in FIGS. 8–10, respectively, wherein $Z_0$ is the amount of defocusing for the greatest difference in intensity. Further, when the wave aberration $\Delta W$ is varied in the equations (2)–(4), the corresponding intensity distributions $I(0)$, $I(p/4)$ and $I(p/2)$ change as indicated by curves 35, 36 and 37 (FIG. 11). However, curve 36 corresponding to the intensity distribution $I(p/4)$ is a constant line regardless of the variation of the wave aberration $\Delta W$.

Further, as is apparent from FIGS. 8–10, at X values 0 or p/2, the intensity distribution $I(X)$ is a maximum or minimum at $Z=|Z_0|$, whereas the intensity distribution $I(X)$ is minimum or between a minimum and a maximum at X values p/4. Therefore, referring to curves 35–37 in FIG. 11, the greater of the magnitude $\Delta I_1$ of the difference between curve 36 and curve 37 (or the difference between the intensity at the position p/4 and the intensity at the position p/2) and the magnitude $\Delta I_2$ of the difference between curve 35 and curve 37 (or the difference between the intensity at the position 0 and the intensity at the position p/2) becomes the difference $\Delta I$ between the maximum and minimum intensity distribution $I(X)$. Since the average of the intensity distribution $I(X)$ is constant even with addition of the wave aberration, the difference $\Delta I$ and the contrast of the image are proportional to each other.

Apparent from FIG. 11, if the greater of the difference $\Delta I_1$ and $\Delta I_2$ is defined to be $\Delta I$, then there exists the wave aberration $\Delta W_0(\ne 0)$ at the greatest difference $\Delta I$, in the other words, when the contrast of the image is the greatest. In view of this, according to the present invention the value of the wave aberration ΔW is set so as to provide the greatest contrast of the image. This allows high precision positional detection even when the mark WM for positional detection has a small level difference between convex portions and concave portions.

Further, as is shown in FIG. 6, since the measurement direction of the mark WM for positional detection is along the X direction, the same effects are produced even if symmetric wave aberration about the optical axis AX is provided in the X direction, instead of providing wave aberration ΔW which is rotation-symmetric with respect to the beams to be detected. In order to provide wave aberration which is symmetric about the optical axis AX in this manner, there may be taken, for example, a method of arranging wherein an optical member (phase plate, etc.) which provides the positions along the X axis and symmetrical about the optical axis Ax with an identical phase difference near the pupil surface (Fourier transformation surface) of the imaging optical system 32.

Further, when the light is provided with wave aberration ΔW by defocusing the mark WM for positional detection from the optimum focusing surface 34, the amount of wave aberration provided may be varied within a certain range. Here, the contrast (difference ΔI between a maximum and minimum) can be increased by adjusting the illumination a value depending on the amount of wave aberration. This increasing will be described by the following computer simulation.

As a precondition for the simulation, in the case of the imaging optical system 32 in FIG. 6, suppose that the numerical aperture N.A. is 0.1, the transparent illumination light is C line (wavelength 656 nm), the difference in level θ (λ) of the mark WM for positional detection is 50 nm, the pitch p is 12 μm, and the duty ratio is 0.5. FIG. 12 shows the results upon calculating the difference ΔI(Z) between the maximum and the minimum of the intensity distribution of the resulting image observed while varying the amount of defocusing Z of the mark WM for positional detection. In FIG. 12, curve 38 shows the properties when the illumination σ value=0.1, while curve 39 shows the properties observed when the illumination σ value is 0.9, and given that the amount of defocusing Z at the maximum difference ΔI(Z) is $Z_0$, the amount of defocusing $Z_0$ when the illumination σ values are 0.9 and 0.1 is $Z_0$ (σ=0.9) and $Z_0$ (σ=0.1), respectively, these amounts of defocusing are as follows:

$$Z_0(\sigma=0.9)=50[\mu m], Z_0(\sigma=0.1)=107[\mu m]$$

Comparison between the difference ΔI (0) at the amount of defocusing Z=0 and the difference ΔI ($Z_0$) at the amount of defocusing Z=$Z_0$ reveals the following facts:

At σ=0.9:

$$\Delta I \{Z_0(\sigma=0.9)\}/\Delta I (0)=2.4$$

At σ=0.1:

$$\Delta I \{Z_0(\sigma=0.1)\}/\Delta I (0)=12.2.$$

Note that the value of ΔI(0) at σ=0.9 differs from the value of ΔI(0) at σ=0.1.

From the above-mentioned, it is apparent that, the provision of wave aberration by defocusing helps that increase the highest contrast of the resulting image is about times or two about twelve-times as compared with the case where the mark is located on the optimum focusing surface. In addison, apparent form FIG. 12, the smaller the illumination value is, the amount of defocusing $Z_0$ for the greatest difference ΔI becomes larger, and further the difference ΔI increases correspondingly. In addition, at the time of either optimum focusing (Z=0) and defocusing, the smaller the illumination σ value is, the difference ΔI is larger, and the influence is more significant at the time of defocusing. Accordingly, provision of the illumination σ value optimized for the optical system and the configuration of the mark, and appropriate wave aberration which is symmetrical about the optical axis AX along the direction of measurement serves to increase the contrast of images even of low level marks and allows their detection.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
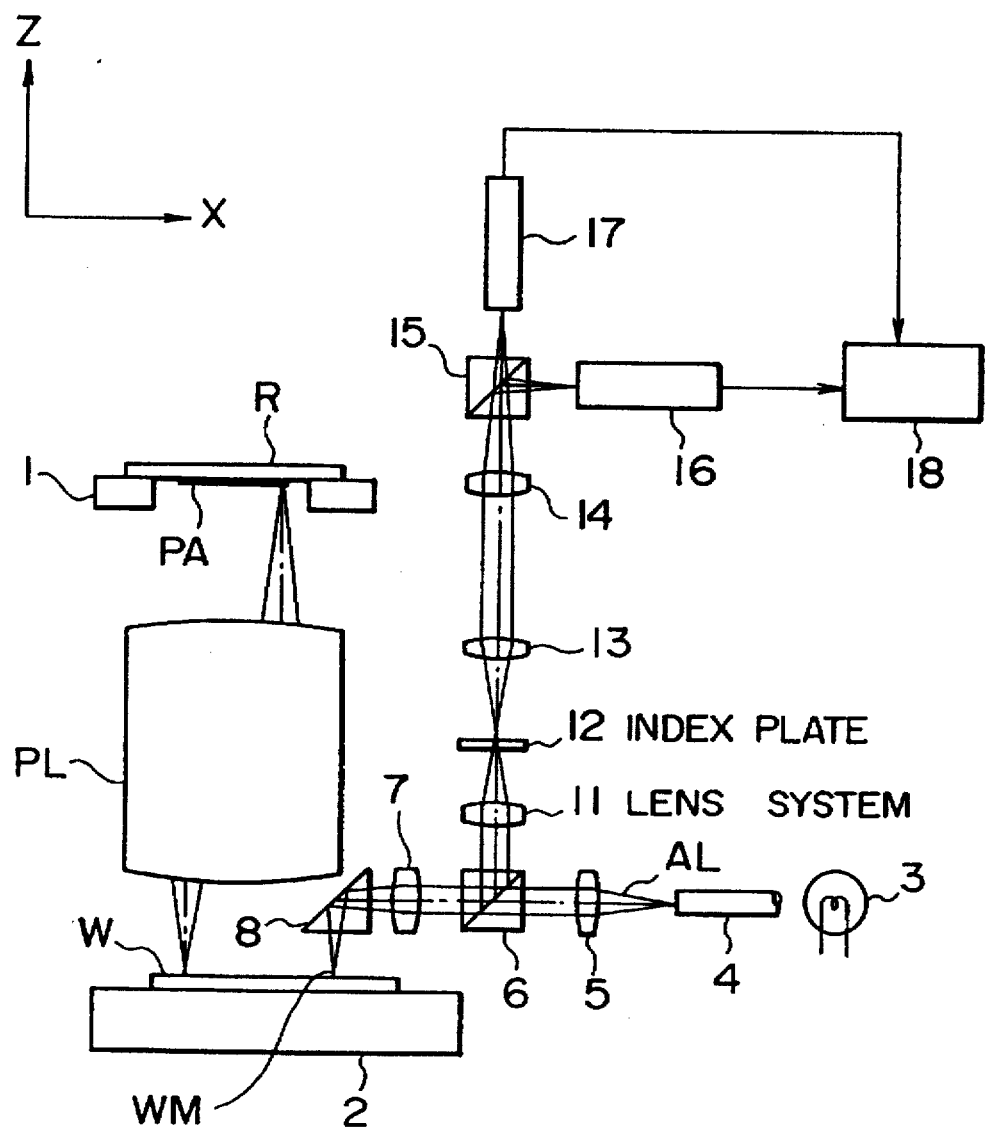
FIG. 1 is a block diagram showing main portions of a projection exposure apparatus equipped with a conventional off-axis type alignment system.
Figure 2:
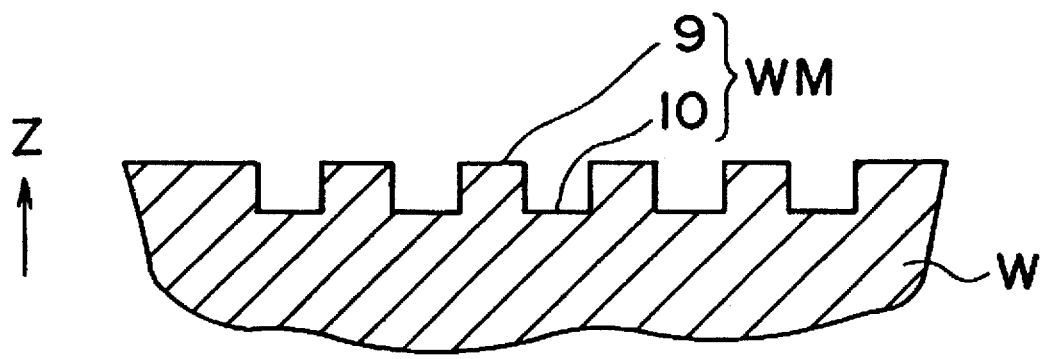
FIG. 2 is an enlarged sectional view showing the structure of a wafer mark WM.

An embodiment of the position detection apparatus according to the present invention will now be explained with reference to FIG. 3 through FIG. 22. This embodiment is an example of application of the present invention to an off-axis type alignment system for projection exposure apparatus, and the parts common to FIG. 3 and FIG. 1 are designated by like reference characters to omit an explanation thereof with respect to FIG. 3.

Figure 3:
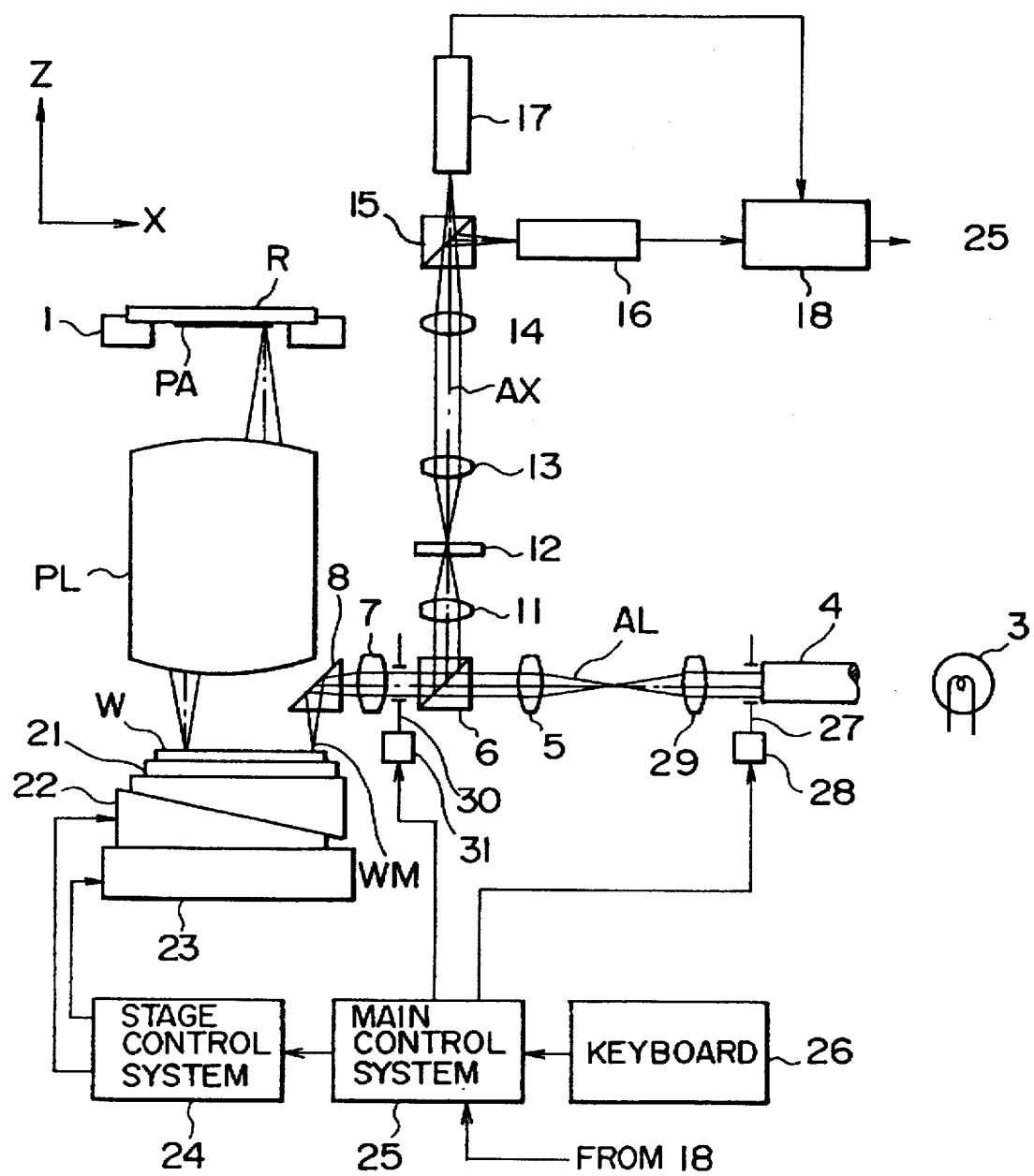
FIG. 3 is a block diagram showing main portions of a projection exposure apparatus which utilizes an embodiment of the position detection apparatus according to the present invention.
Figure 4:
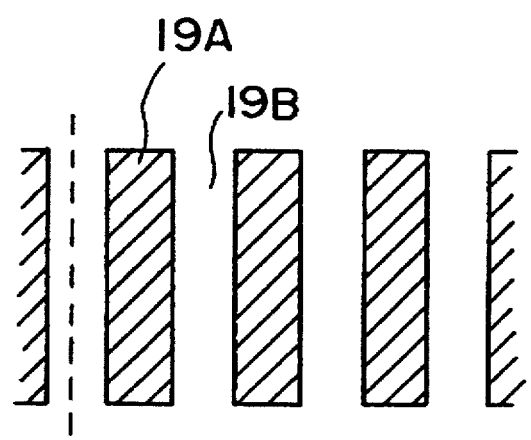
FIG. 4 is an enlarged plane view showing a projection image of a plain mark.
Figure 5:
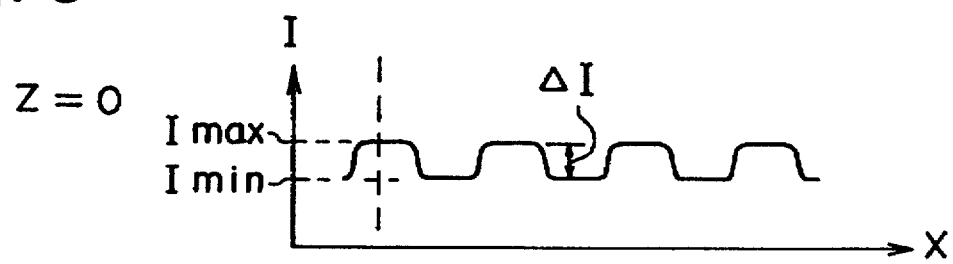
FIG. 5 illustrates the intensity distribution of a projection image of a plain mark.

FIG. 3 shows main portions of an projection exposure apparatus of this embodiment, wherein in each shot area on the wafer there are formed wafer marks (not shown) for the X-axis and the Y-axis comprising uneven patterns (phase lattices). The wafer is mounted on a Z-stage 22 via a wafer holder 21, while the Z-stage is mounted on an XY-stage 23. The Z-stage 22 is for positioning of the wafer W in the Z-direction parallel to the optical axis of the projection optical system PL, whereas XY-stage 23 is for positioning of the wafer W in the XY-plane perpendicular to the Z-axis. The main control system 25, which controls the operation of the entire apparatus, sets the information on the ordinates of the aimed position of the wafer W in the XY-plane and the information on the aimed position of the wafer W in the Z direction in the stage control system 24, and the stage control system 24 controls the Z-stage 22 and XY-stage 23. To the main control system 25 is connected a keyboard 26, and the operator may input the information on the pitch, difference in level, etc. of the wafer mark WM to the main control system 25 via the keyboard.

Figure 13:
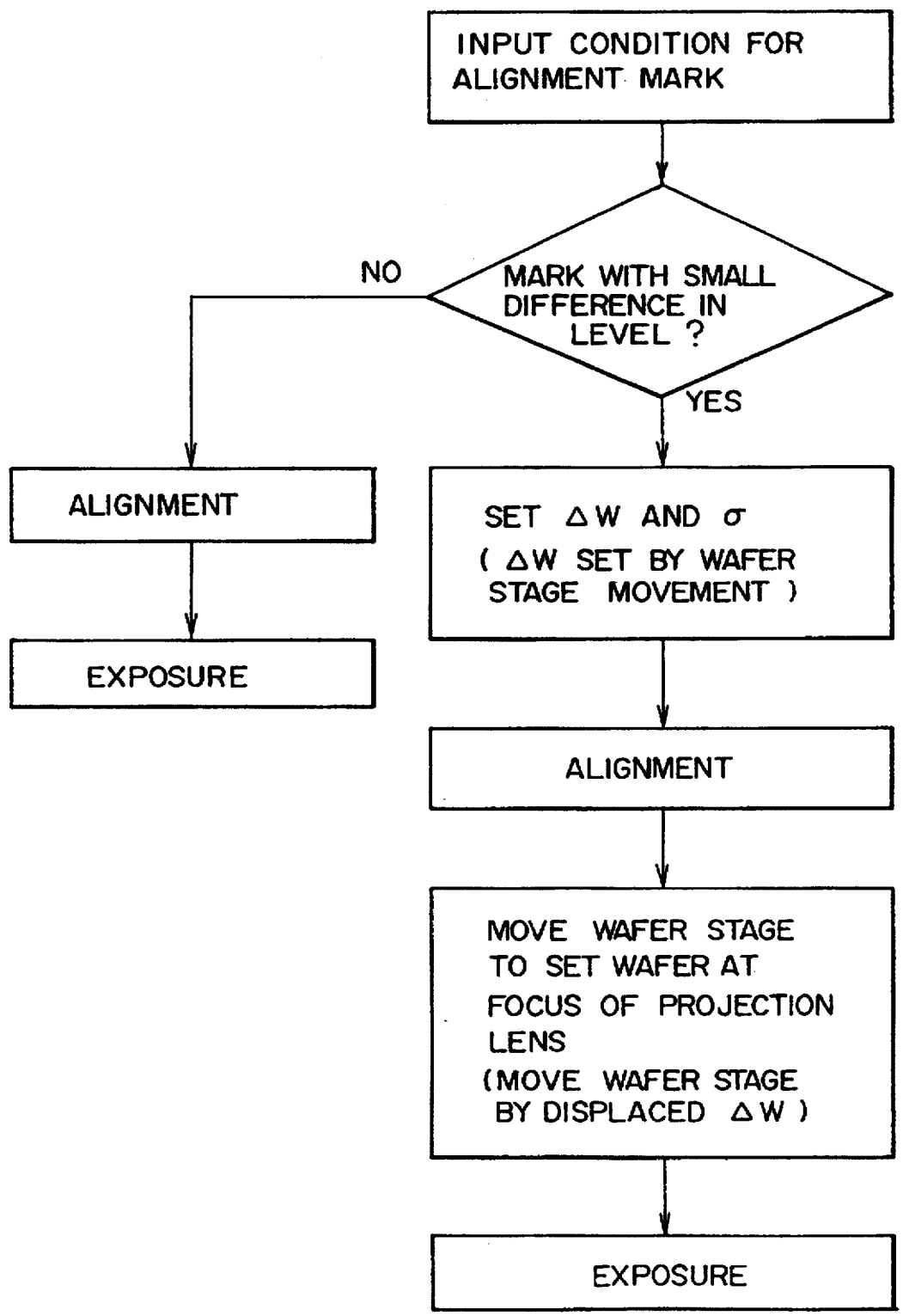
FIG. 13 is a flow chart illustrating the operation of the apparatus of FIG. 3.

FIG. 13 is a flow chart illustrating the operation for position detection and exposure with an apparatus according to the present invention. As illustrated in FIG. 13, prior to the practice of position detection and exposure a variety of conditions for alignment which will possibly be measured, including difference in level, pitch and duty ratio of the mark as well as the refractive index of the mark, etc. are input to the main control system 25. Actually, when a wafer, or the object of measurement, is delivered, the main control system 25 determines whether the mark WM to be measured is low level mark. There are two methods for determination which follow:

(1) First defemination method:

In cases the information of each of the wafers arriving successively has already been input, whether the marek is a low level mark is determined based on that information.

(2) Second determination method:

Unless an alignment signal indicating that the alignment mark is a high level mark, which implies no necessity for position detection characteristic of the present invention, is detected, the mark is determined to be a low level mark.

Thus, based on the result of determination, only when the mark is determined to have a low level mark, position detection comprising a characteristic aspect of the present invention is carried out.

Though not shown, the projection optical system PL is provided, at its side, with a focus position detection system comprising a projection optical system for obliquely projecting a slit pattern image on the exposure surface of the wafer, a condensing optical system which reimages the slit pattern image by condensing the reflected light from the exposure surface, a signal processing system which generates a focus signal depending on amount of the lateral displacement of the slit pattern image formed by reimaging and feeds the signal to the main control system 25. Here, calibration is performed so that the focus signal is zero when the exposure surface of the wafer W matches the imaging surface of the projection optical system PL, and the main control system 25 controls the exposure surface of the wafer W to match the imaging surface of the projection optical system PL so as to set the focus signal to zero when an image of the pattern of a reticle R is exposed.

However, in cases the wafer mark WM on the wafer W and other wafer marks are detected for alignment of the wafer W, the Z-stage 22 is operated to defocus the wafer in the Z-direction, thereby providing beams incident on the alignment system from the wafer mark WM on the wafer W, with certain wave aberration. That is, in this embodiment the Z-stage is wave aberration-providing means.

In the alignment system in this embodiment, illumination light AL from a halogen lamp 3 is emitted from the other end of the light 4. There is positioned a variable aperture stop (hereunder referred to as "variable σ stop") 27 at the other end of the light 4, and the illumination light AL which has passed the aperture of the variable σ stop 27 is once condensed by a condensing lens 29, and then converted to substantially parallel beams by a collimator lens 5. The illumination light AL comprising these substantially parallel beams illuminate the wafer mark WM on the wafer W and its surrounding area via a half prism 6, a objective lens 7, and a total reflection prism 8. In addition, between the half prism 6 and the objective lens 7 is located a variable aperture stop 30 for the imaging system.

The variable σ stop 27 and the variable aperture stop 30 are arranged in planes conjugate with each other, and given that the magnification of the system comprising a condensing lens 29 and a collimator lens 5 is 1, the aperture diameter of the variable σ stop 27 is $\Phi_{iL}$, and the aperture diameter of the variable aperture stop 30 is $\Phi_{aP}$, the illumination σ value, or the value of the ratio of numerical aperture of the illumination optical system and the numerical aperture of the imaging optical system may be expressed as follow:

Illumination sigma σ value=$\Phi_{iL}/\Phi_{aP}$  (5)

In this connection, of the two aperture stops 27 and 30, the aperture of either aperture stop may be constant, and the aperture of the other aperture stop may be variable, in which case the illumination σ value may be variable as well.

Incidentally, since the illumination σ value is 1 or less, $\Phi_{iL}/\Phi_{aP}$ holds. Accordingly, all the illumination light AL emitted through the aperture of the variable a stop 27 travels through the aperture of the variable aperture stop 30, toward the wafer. Then, the light reflected from the wafer mark WM or its surrounding area returns to the half prism 6 via the total reflection prism 8, objective lens 7 and variable aperture stop 30, and an image of the wafer mark WM is formed on the index plate 12 by the light reflected from the half prism 6 via the imaging lens 11. With the optimum focusing surface of the objective lens with respect to the plain dark and light pattern mark as the standard, the variable aperture stop 30 is positioned on the Fourier transform surface (pupil surface) of the optimum focusing surface by the objective lens 7.

By the light having passed through the index plate 12, an image of the wafer mark WM and an image of the index mark are formed on the image pickup surfaces of a two-dimensional image pickup devices 16 and 17 via the first relay lens 13, second relay lens 14 and half prism 15, and to the main control system is fed information on the amount of displacement of the wafer mark obtained by processing the image pickup signals from the two-dimensional image pickup devices 16 and 17.

Next, an explanation will be given regarding how the illumination σ value is set according to the present invention. First, the main control system 25 adjusts the aperture diameter of the variable σ stop 27, using a drive unit 28 or adjusting the aperture diameter of the variable aperture stop 30 using a drive unit 31, then the σ value is adjusted by Equation (5). In the memory of the main control system 25, there is stored beforehand information on the illumination σ value for the highest contrast of the image on the image pickup surface 33 of the imaging optical system 32 and the amount of defocusing $Z_0$ (described later) of the wafer mark WM, which correspond to the particular type of the wafer mark WM. Therefore, the operator inputs, from the keyboard 26, information on the difference in level θ (λ), pitch p, duty ratio, etc. of the wafer mark WM to the main control system 25. In response to this input, the main control system 25 sets the illumination a value via drive units 28 and 31.

Figure 6:
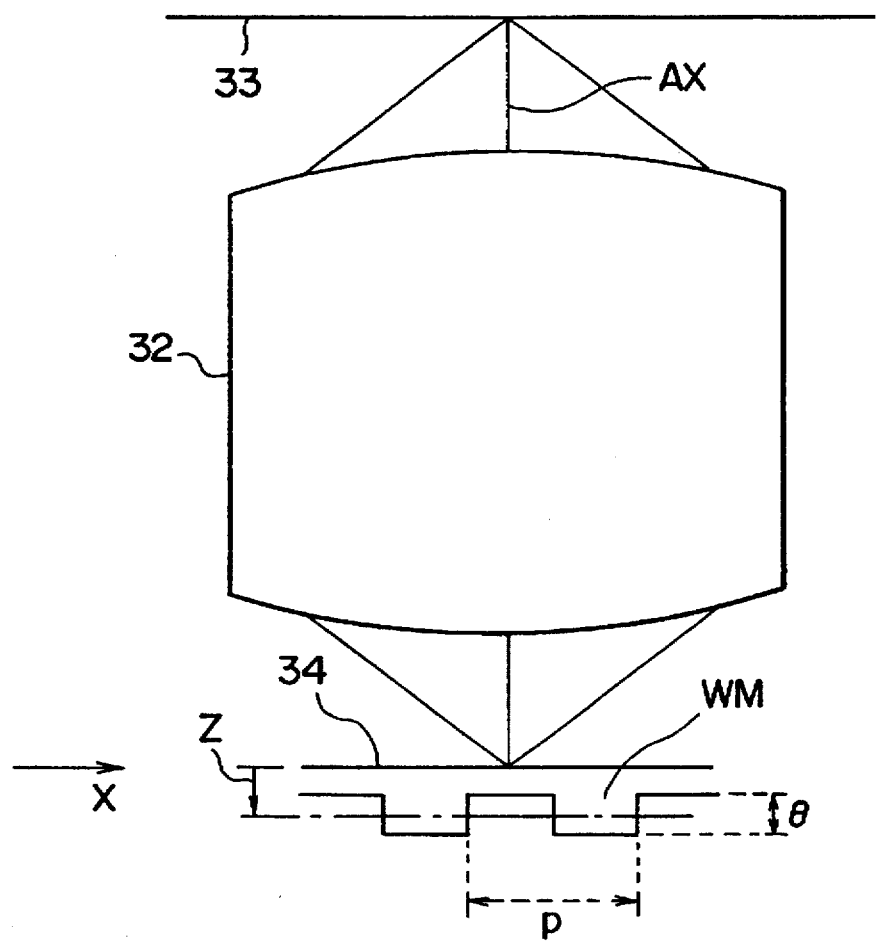
FIG. 6 is a schematic view showing the imaging optical system of FIG. 3.
Figure 7:
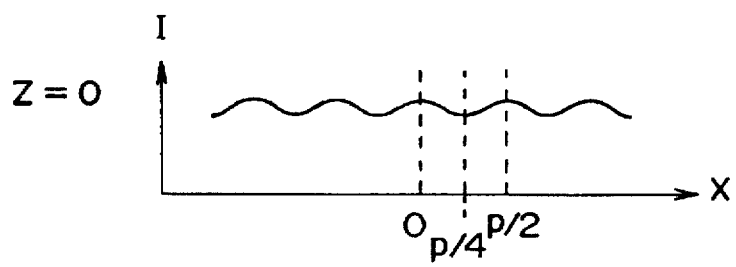
FIG. 7 illustrates the intensity distribution of the image formed on the image pickup surface of FIG. 6.

Next, a method of providing the beams from the wafer mark WM with wave aberration according to the present embodiment will be explained while referring to FIGS. 6–10. FIG. 6 is a schematic view of an alignment system according to the present embodiment; in FIG. 6, the imaging optical system 32 is a counterpart of the optical system of FIG. 1 which comprises the objective lens 7, imaging lens 11, first relay lens 13 and second relay lens 14, the image pickup surface corresponds to the image pickup surfaces of the two-dimensional image pickup devices 16 and 17 of FIG. 3, and the surface conjugate with both the imaging surface 33 and the imaging optical system 32, or the optimum focusing surface for a plain, dark and light pattern is taken as the optimum focusing surface 34. Supposing that this optimum focusing surface 34 matches the imaging surface of the projection optical system PL of FIG. 3, the wafer mark WM is taken as an uneven pattern with a pitch p in the direction of measurement (X direction) and a duty ratio 0.5. Separately, the X-directional intensity distribution I(X) of the image on the image pickup surface 33 in the case where the average surface of the wafer mark WM matches the optimum focusing surface 34, is shown in FIG. 7. Given that the magnification of the imaging optical system 32 is 1, the X-directional pitch of the image in such case is p/2, as is apparent from FIG. 7.

In the present embodiment, by operating the Z-stage 22 to defocus the position of the phase lattice-like wafer mark WM on the wafer W from the optimum focusing surface 34 to the optical axis AX of the imaging optical system 32, the beams travelling from the wafer mark WM to the image pickup surface 33 via the imaging optical system 32 is provided with wave aberration which is rotation-symmetrical about the optical axis AX. By providing wave aberration in this way, the contrast of the image formed by the imaging optical system 32 on the image pickup surface 33, or the difference ΔI between a maximum and minimum of the intensity distribution I(X) is maximized to perform alignment.

Figure 8:
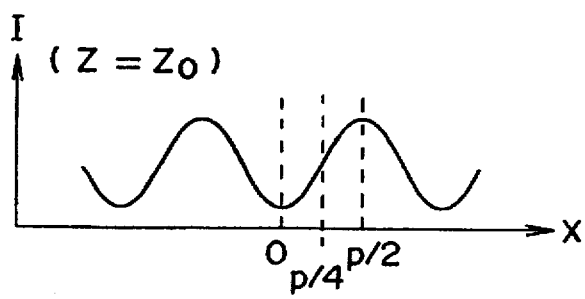
FIGS. 8–10 are views showing the intensity distributions of images formed on image pickup surfaces, observed while varying the amount of defocusing of the wafer mark.
Figure 9:
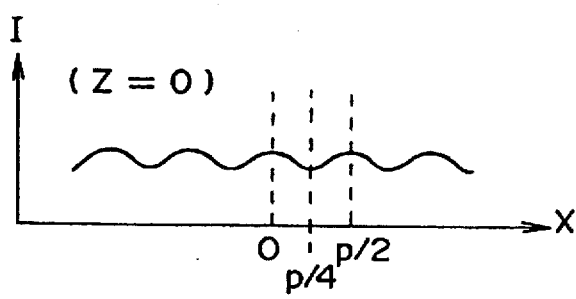
Figure 10:
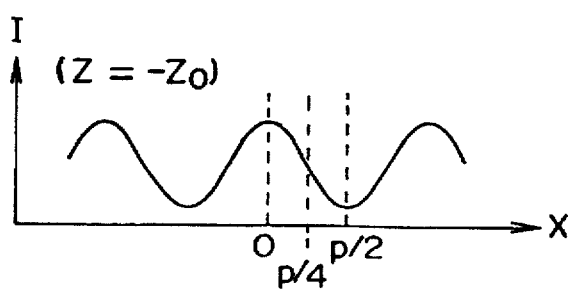

Concrete intensity distribution I(X) of the image on the image pickup surface 33 in the case where the amount of defocusing Z is set to $Z_0$ for the highest contrast, 0 and $-Z_0$, is shown in FIGS. 8–10, respectively. As shown in the drawings, the contrast of the image becomes the highest also when the amount of defocusing Z is $-Z_0$, with the phases reversed for the case of $Z_0$ and for the case of $-Z_0$.

Further, in the cases of FIG. 8 and FIG. 10, the pitches are p, or twice the pitch in the case where the average surface of the wafer mark WM coincides with the optimum focusing surface 34 (FIG. 9).

Figure 11:
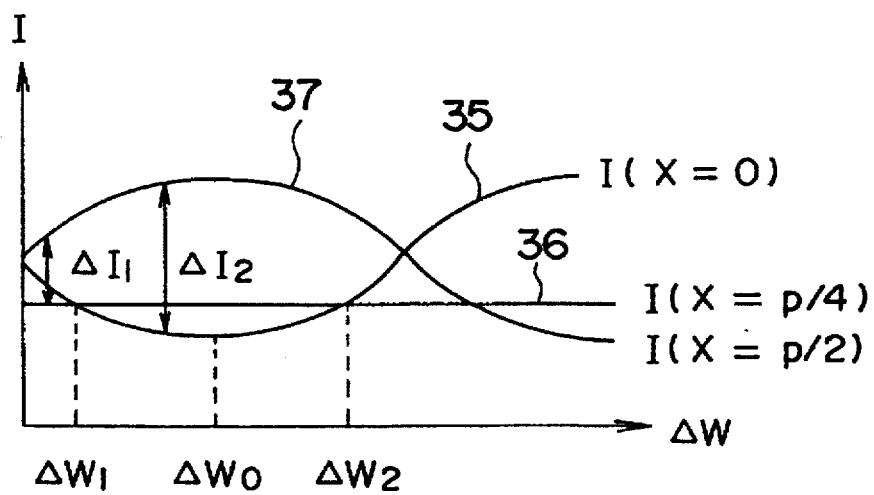
FIG. 11 is a view illustrating changes in the intensity distributions of images at various points corresponding to amounts of wave aberration ΔW.

Thus, the amount of defocusing $Z_0$ for the highest contrast of the image depends on the pitch, duty ratio and difference in level of the wafer mark WM, and the numerical aperture and the illumination σ value of the imaging optical system 32, and therefore the optimum defocusing amount is stored in the memory of the main control system 25. The amount (Z) of actual defocusing (Z') is not necessary to be the one ($Z_0$) for the highest contrast. If the pitch of the signal is less than mark pitch p, or a value twice the pitch in the case of the optimum focusing surface (FIG. 9), as shown in FIG. 8 or FIG. 10 then the position of the center of the wafer mark may be calculated by outer slope or inner slope detection methods (see Japanese Patent Application Disclosure HEI No. 4-65603). The range is $$\sigma W1 \geq \sigma W \geq \sigma W2 \quad (6)$$

as shown in FIG. 11. With the condition used for Equation (1) and the wave aberration expressed as the amount of defocusing, Equation (6) may be transformed as follows:

$$(p^2/\pi\lambda)\sin^{-1}[(4/\pi)(\sin^2(\theta/2)/\sin\theta)] \leq Z \leq \quad (7)$$

$$(p^2/\lambda)(1 - \sin^{-1}[(4/\pi) \times (\sin^2(\theta/2)/\sin\theta)]/\pi).$$

Figure 12:
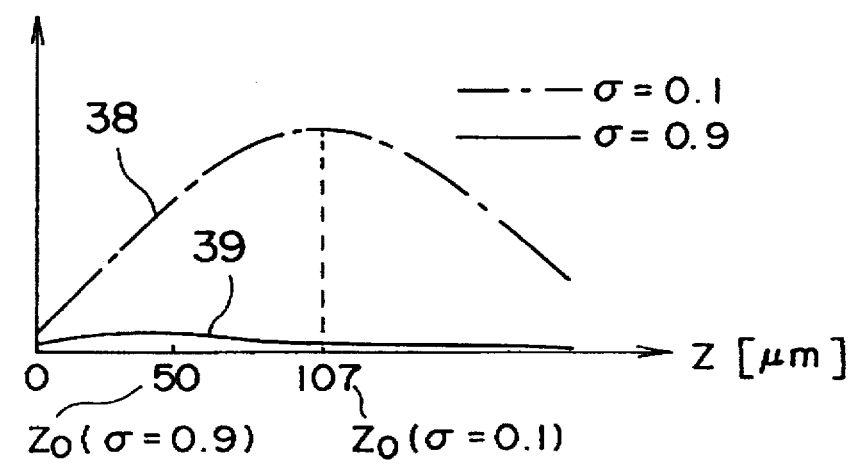
FIG. 12 is a view illustrating the relationship between the amount of defocusing Z of the wafer mark, and the difference ΔI between a maximum and minimum of the intensity distribution of the resulting image, observed while varying illumination σ values.

Although the amount of defocusing z' actually varies depending on the illumination condition, configuration of the mark, etc., it is necessary to defocus at least more than the depth of focus. An exemplary optimum amount of defocusing $Z_0$ is shown in FIG. 12. Therefore, the main control system 25 reads out an optimum amount of defocusing for the existing condition from the memory. Thereafter, using focus signals from a focus position detection system (not shown), the main control system 25 first matches the Z-directional position of the wafer mark WM on the wafer W with the optimum focusing surface 34. Thereafter, the main control system 25 defocuses the wafer mark WM on the wafer W by $Z_0$ with respect to the optimum focusing surface 34, via the stage control system 24 and the Z-stage 22 of FIG. 3. Since this defocusing allows the positional detection of the wafer mark WM to be performed with the highest contrast, high precision positional detection may be carried out even if the wafer mark WM has a low level mark.

Although in the foregoing embodiment the illumination σ value and an optimum defocusing amount $Z_0$ is determined based on the content stored in the memory in advance, the contrast of the image which has been obtained by picking up an image on the image pickup surface 33 by two-dimensional image pickup devices 16 and 17 may be calculated from the image pickup signals which have been obtained by picking up the image of the image pickup surface 33, to determine the illumination σ value, and an optimum amount of defocusing $Z_0$.

Figure 14:
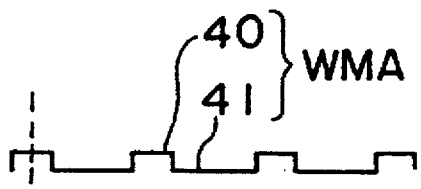
FIGS. 14–17 are views illustrating how to observe images of repetitive patterns with a duty ratio other than 0.5.
Figure 15:
Figure 16:
Figure 17:

Next, with reference to FIGS. 14 through 18, an explanation will be given regarding detection of positions of wafer marks comprising repetitive uneven patterns having a duty ratio other than 0.5. FIG. 14 shows a wafer mark WMA comprising a protrusion section 40 and a recess section 41 which regularly repeat in the direction of measurement; since the width of the protrusion section 40 is different from the width of the recess section 41, this shows a case where the duty ratio is not 0.5. Here, FIGS. 15–17 show respectively the intensity distributions of the images on the image pickup surface 33 when the amount of defocusing Z of the wafer mark WMA from the optimum focusing surface 34 is set to $Z_0$ for the highest contrast, 0 and $Z_0'$ of opposite sign to $Z_0$ and which also provides the highest contrast.

Figure 18:
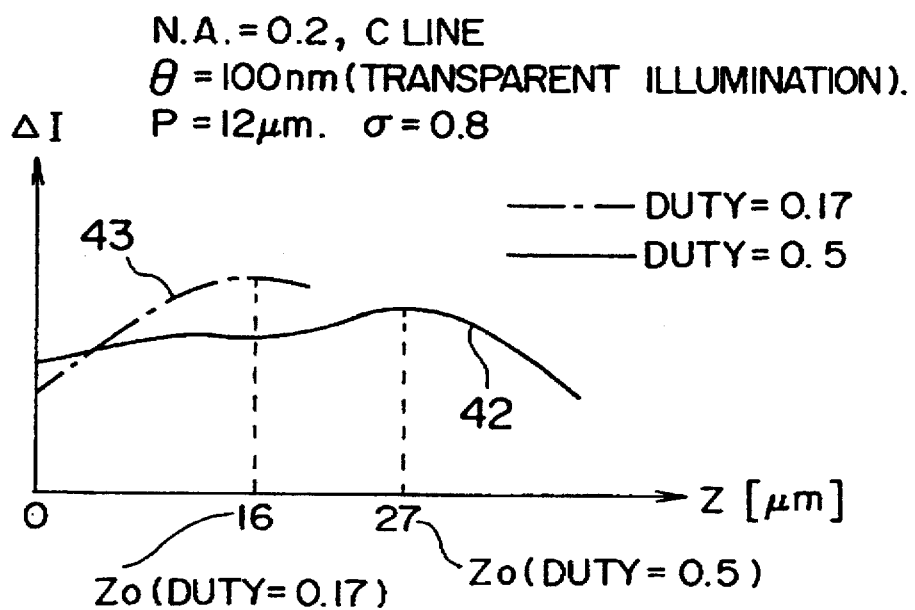
FIGS. 18 is a view illustrating the relationship between the amount of defocusing Z of the wafer mark, and the difference ΔI between a maximum and minimum of the intensity distribution of the resulting image, observed while varying the duty ratio of the wafer mark.

That is, when the duty ratio is not 0.5, the change in the difference ΔI between a maximum and minimum of the intensity distribution of the image is not symmetric with respect to the +Z direction and the Δ-Z direction, and the amount of defocusing Z for a maximum difference ΔI exists only in the direction of either +Z or −Z. More specifically, suppose that the numerical aperture N.A. of the imaging optical system 32 is 0.2, the illumination light is C line (wavelength 656 nm) and illumination σ value is 0.8 on the assumption that transparent illumination is employed, and in FIG. 17, the wafer mark WMA has a difference in level of 100 nm, and a pitch p of 12 μm. At different duty ratios of the wafer mark WMA, the amount of defocusing Z of the wafer mark WMA is gradually varied, and the differences ΔI (Z) between a maximum and a minimum of the intensity distribution of the resulting image were calculated; the results are shown in FIG. 18. In FIG. 18, curve 42 shows the properties of a case where the duty ratio is 0.5, while curve 43 shows properties at a duty ratio of 0.17, and regarding curves 42 and 43, the amounts of defocusing $Z_0$ for the large difference σI (the largest difference for the highest contrast) are 27 μm and 16 μm, respectively.

Figure 19:
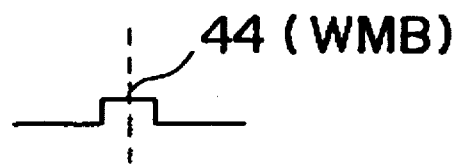
FIGS. 19-22 are views illustrating how to observe images of discrete patterns.
Figure 20:
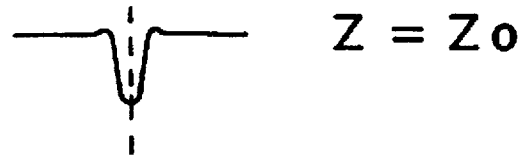
Figure 21:
Figure 22:
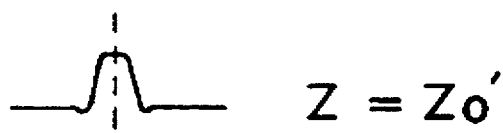

As shown in FIG. 18, it is apparent that, if the pitch of the wafer mark in the direction of measurement is fixed, the absolute value of an optimum amount of defocusing $Z_0$ becomes smaller, and the difference ΔI (contrast) increases in response to the variation in the duty ratio from 0.5. Thus there is an advantage in that a smaller optimum defocusing amount $Z_0$ results in a higher telecentricity of the imaging optical system 32, and a shorter offset with respect to the focus variation. Although the above embodiment is for positional detection of repetitive patterns, the present invention may be applied to detection of positions of discrete patterns as well. Referring to FIGS. 19–22, the case of detection of positions of wafer marks comprising discrete convex and concave patterns will be explained. FIG. 19 shows a wafer mark WMB formed as a convex part 44 on the surface of the wafer. Here, the intensity distribution of the image on the image pickup surface 33 when the amount of defocusing Z of the wafer mark WMA from the optimum focusing surface 34 is set to $Z_0$ for the highest contrast, 0 and $Z_0'$ of opposite sign to $Z_0$ and which also provides the highest contrast is shown in FIGS. 20–22, respectively.

That is, also for discrete patterns, the change in the difference ΔI between a maximum and minimum of the intensity distribution of the image is not symmetric with respect to the +Z direction and the −Z direction, and the amount of defocusing Z for a maximum difference ΔI exists in the direction of only one of +Z and −Z. By optimizing the amount of defocusing in this manner, detection of the position of the wafer mark WMB may be performed with the aid of the high contrast of the image.

Figure 23:
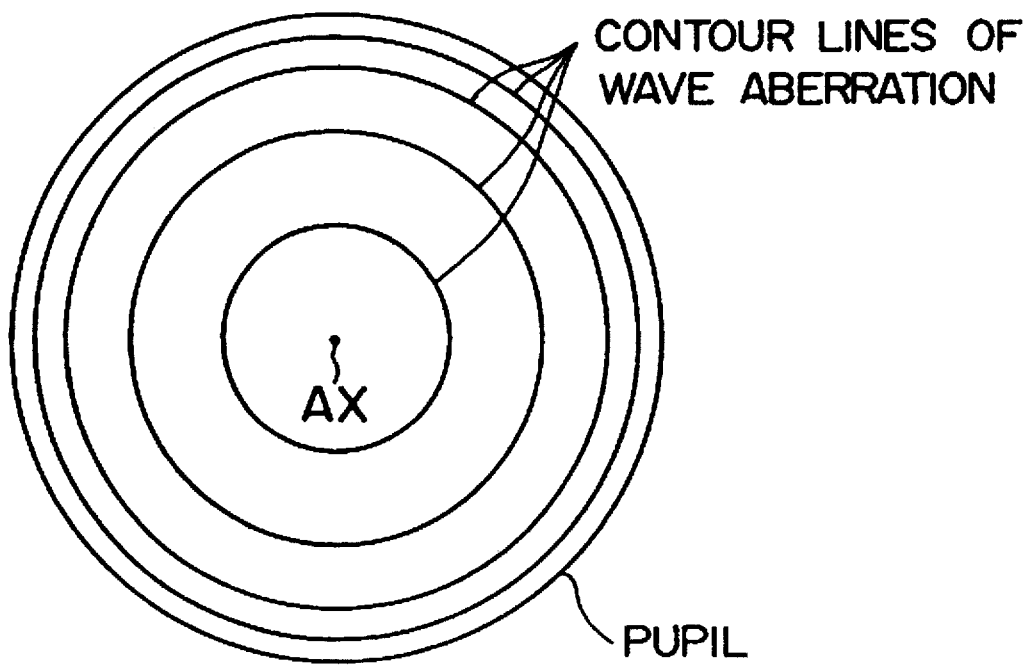
FIG. 23 is a view showing the state of wave aberration which is rotation-symmetrical about the optical axis AX of an imaging optical system.

Incidentally, in the above embodiment, the wave aberration symmetrical about the optical axis AX along the direction of measurement which was borne in mind was rotation-symmetrical wave aberration provided by defocusing of the wafer mark, as is shown in FIG. 23. However, various other methods may be used for provision of such rotation-symmetrical illumination. First, with regard to defocusing, also movement of any of the two-dimensional image pickup devices 16 and 17, objective lens 7, imaging lens 11, first relay lens 13 and second relay lens 14 may provide the beams from the wafer mark WM with rotation-symmetrical illumination.

Figure 24:
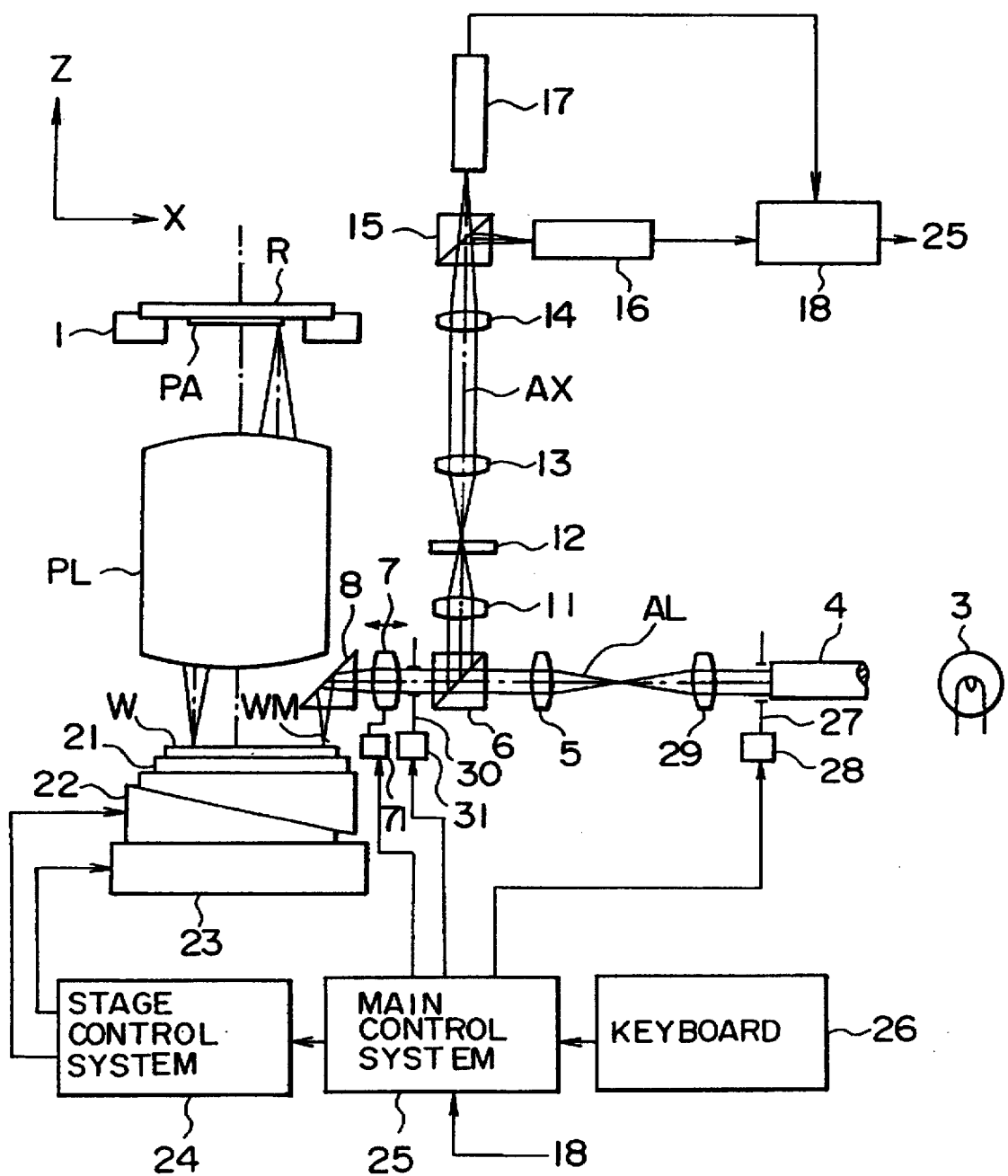
FIG. 24 is a view showing the structure of an embodiment of an apparatus which provides wave aberration by movement of a lens 7.
Figure 25:
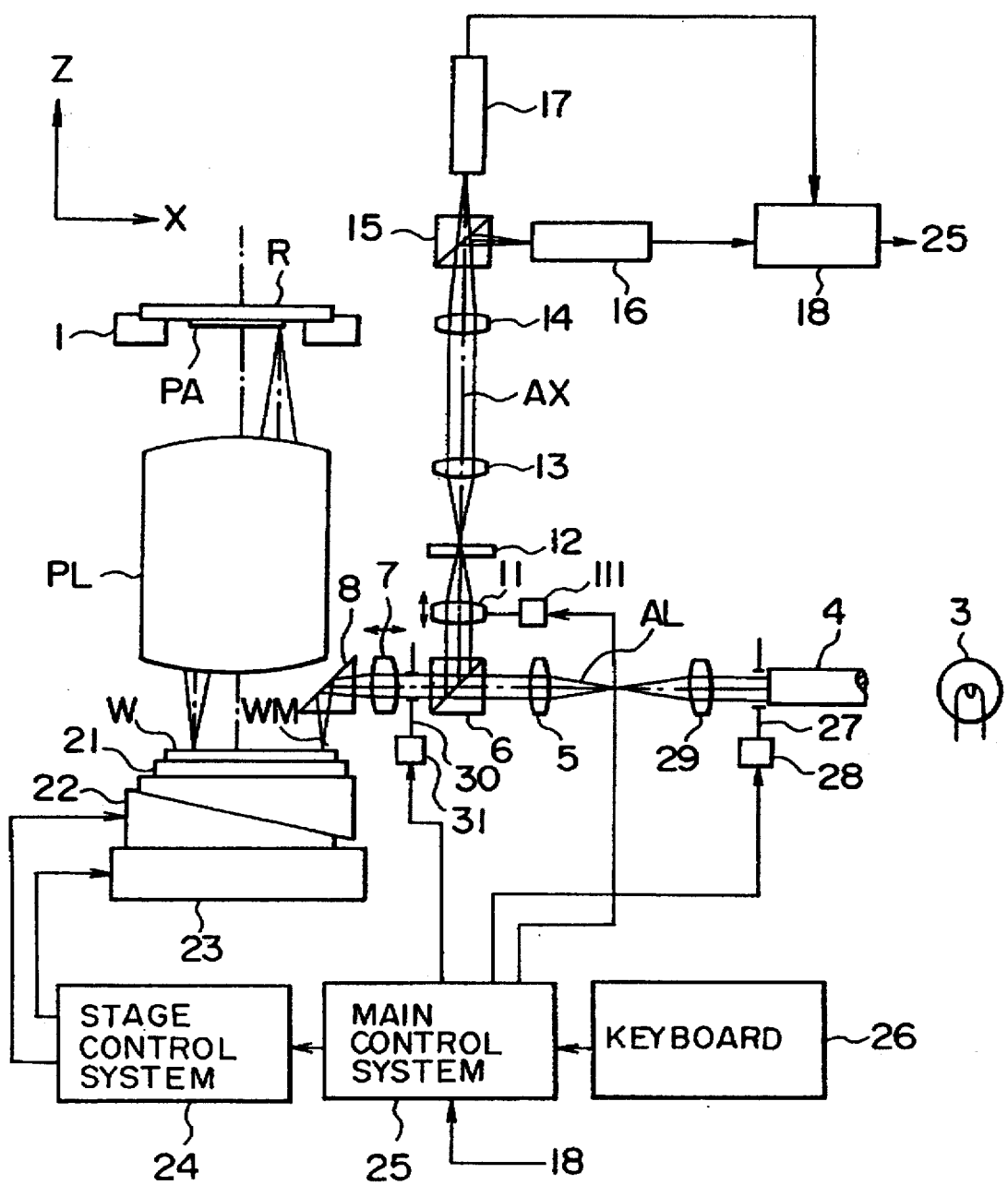
FIG. 25 is a view showing the structure of an embodiment of an apparatus which provides wave aberration by movement of a lens 11.

FIG. 24 illustrates the structure of an apparatus which provides wave aberration by moving a objective lens 7 with a lens carrier 71, whereas FIG. 25 illustrates the structure of an apparatus which provides wave aberration by moving an imaging lens 11 (or lenses composing the imaging lens 11, a lens which is sensitive only to symmetrical aberration when the lens distance is varied by movement of part of the lenses) with a lens carrier 111.

Further, without being limited to defocusing, it is also possible to increase the contrast of the image by inserting another optical member which creates spherical aberration, curvature of field, etc. into the pupil surfaces of the imaging optical systems (7 and 11; 13 and 14). Separately, a lens distance may be chosen which barely influences asymmetrical aberration, but greatly influences symmetrical aberration components, and rotation-symmetrical wave aberration may be provided by a change in the distance.

Figure 26:
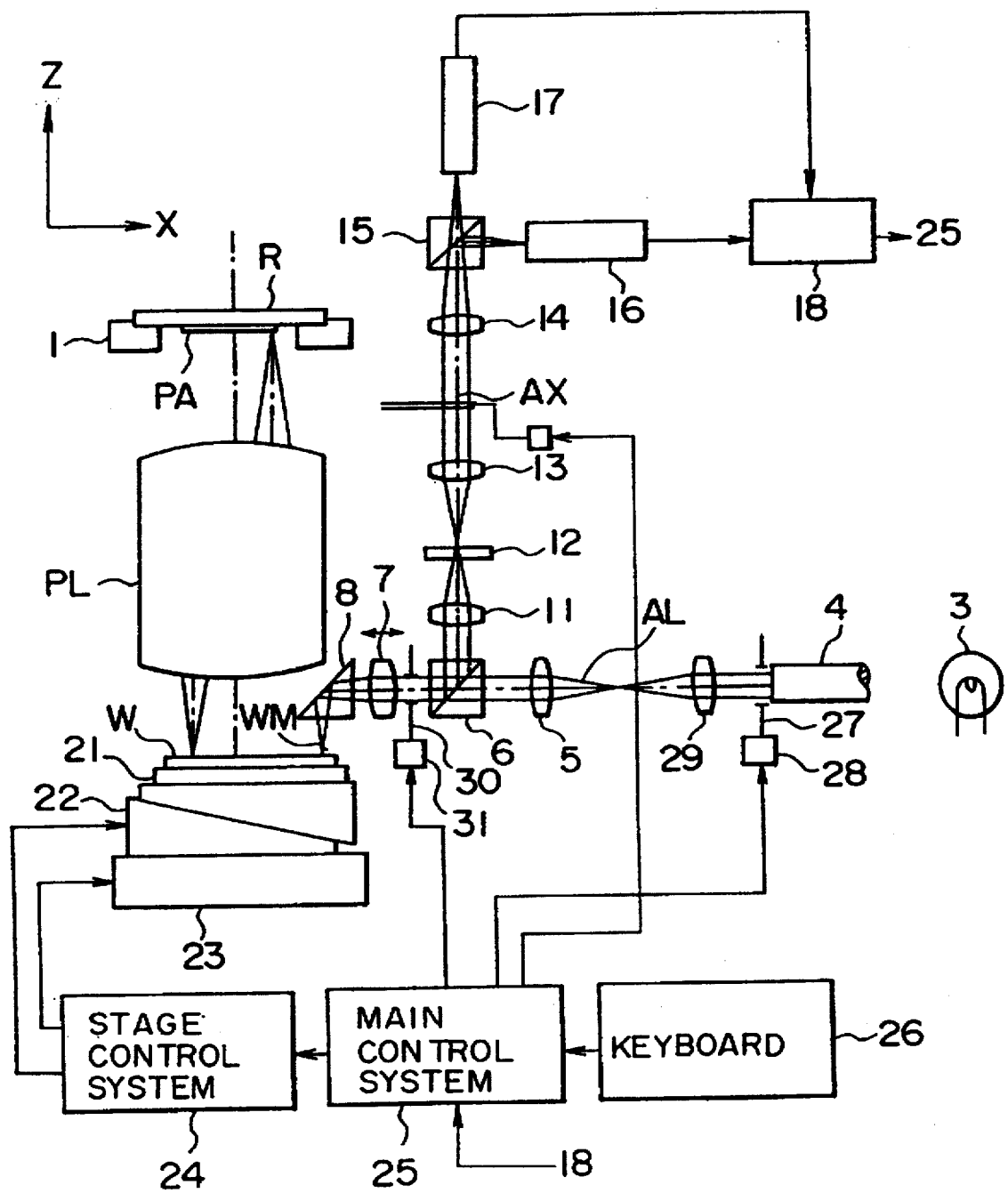
FIG. 26 is a view showing the structure of an embodiment of an apparatus which provides wave aberration by insertion of an optical member.
Figure 27:
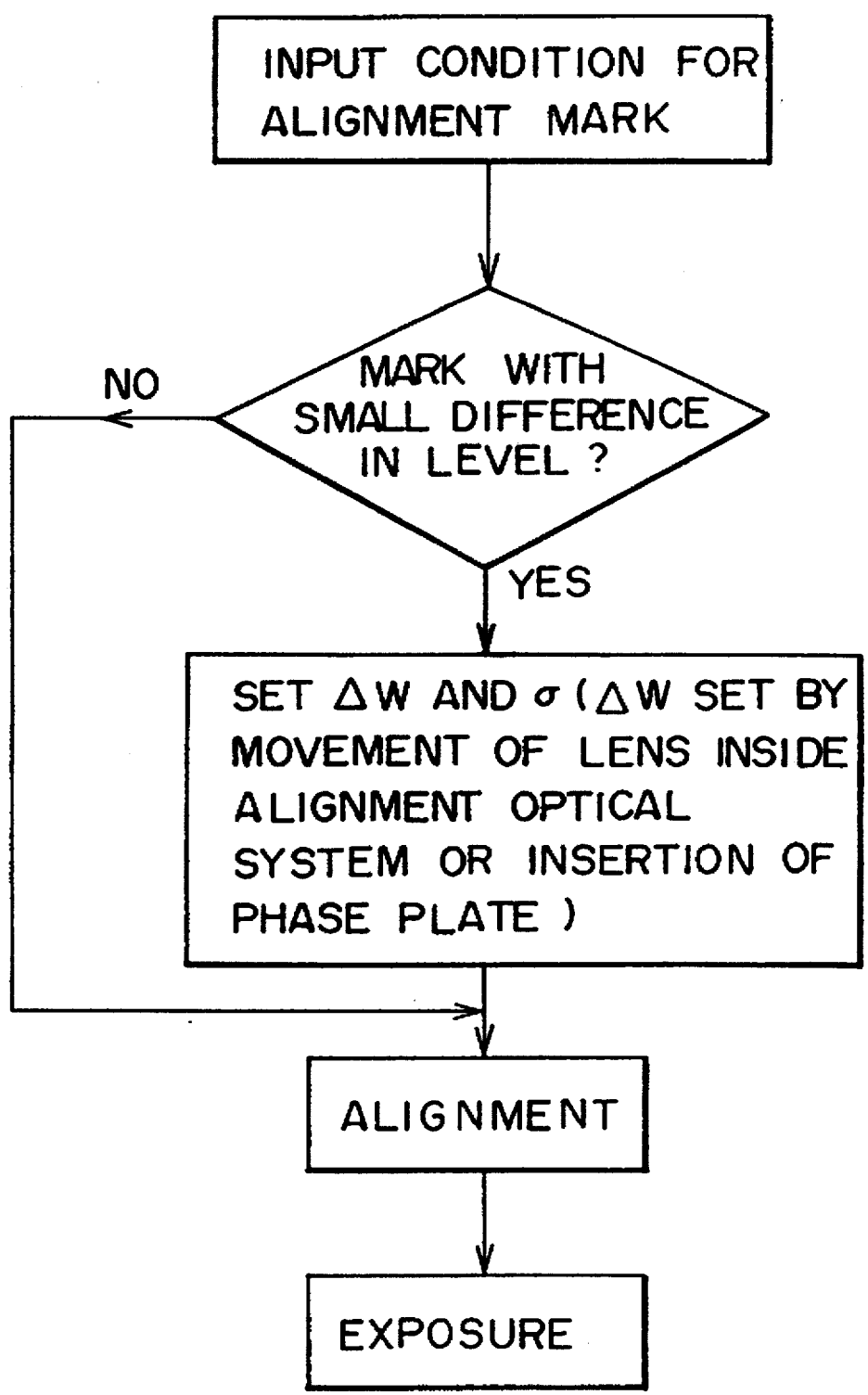
FIG. 27 is a view showing the structure of an embodiment of an apparatus which provides wave aberration by movement of a lens or by insertion of an optical member.

FIG. 26 illustrates the structure of an apparatus with the members inserted into the pupil surfaces of the lens 13 and lens 14 of the imaging optical system. FIG. 27 shows a flow chart for detection of a low level mark by movement of the lens inside the alignment optical system, or insertion of a phase plate into the alignment system. Also for these cases there are two procedures for determining whether the mark is a low level mark, in the same manner as in FIG. 13. As mentioned above, according to the present invention, phase plates (A and A' in FIG. 28; B and B' in FIG. 29; and C and C' in FIG. 30) provided not only with wave aberration which is rotation-symmetrical about the optical axis AX of the imaging optical system shown in FIG. 23, but with, e.g., phase difference or phase difference components which are symmetrical about the optical axis AX of the imaging optical system, may be arranged in the pupil surface of the imaging optical system or its surrounding area, along the direction of measurement to provide the beams from the wafer mark WM with wave aberration or wave aberration components which are symmetrical about the imaging optical system along the direction of actual measurement.

Figure 28:
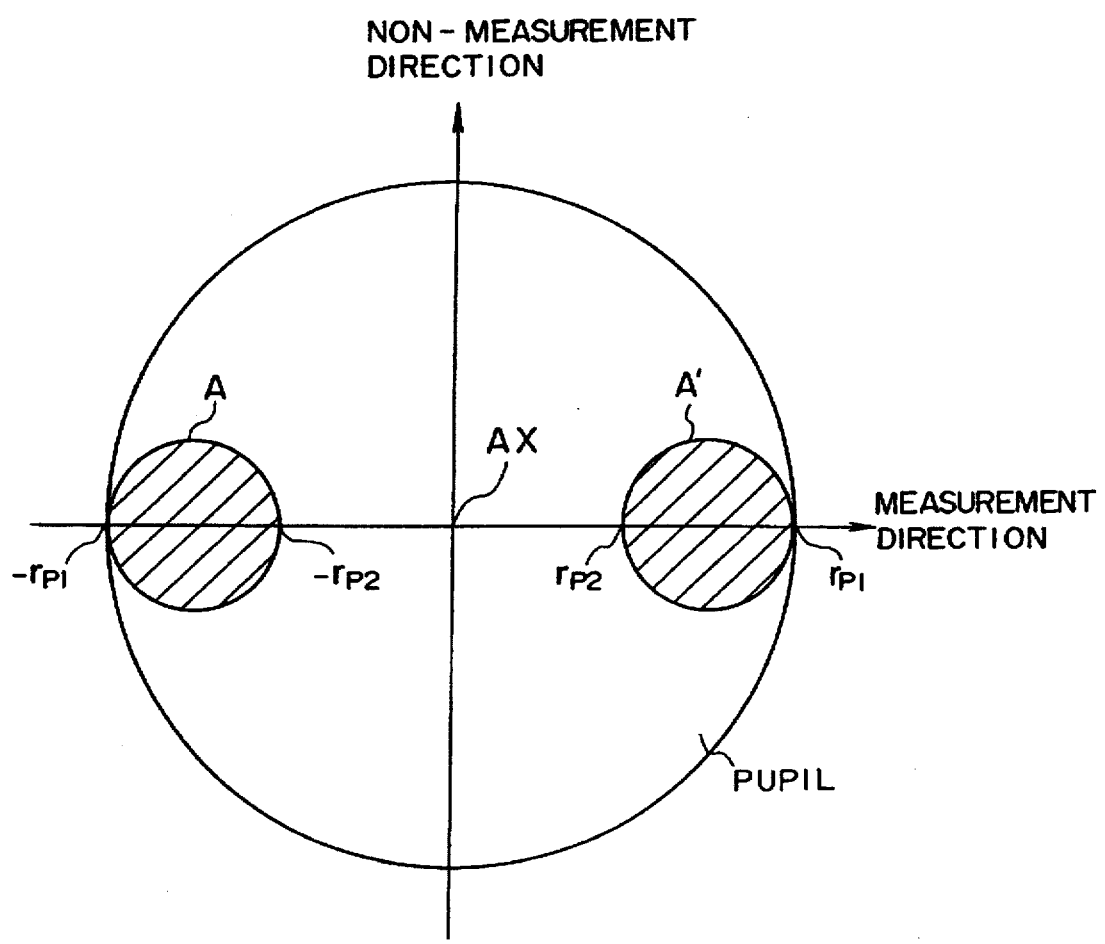
FIG. 28 is a view showing the state of a pair of phase plates (A, A') inserted and positioned at points symmetrical about the optical axis AX of an imaging optical system, in the pupil surface of the imaging optical system or its surrounding area, along the direction of measurement.
Figure 31:
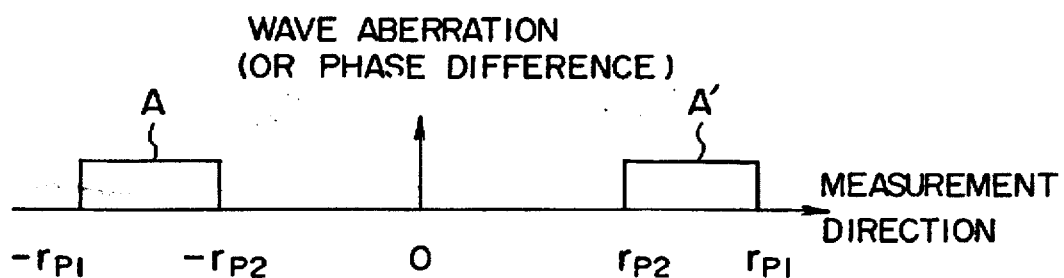
FIG. 31 is a view showing the state of the pair of phase plates (A, A') positioned at the points shown in FIG. 28 and having certain constant wave aberration (or phase difference)
Figure 32:
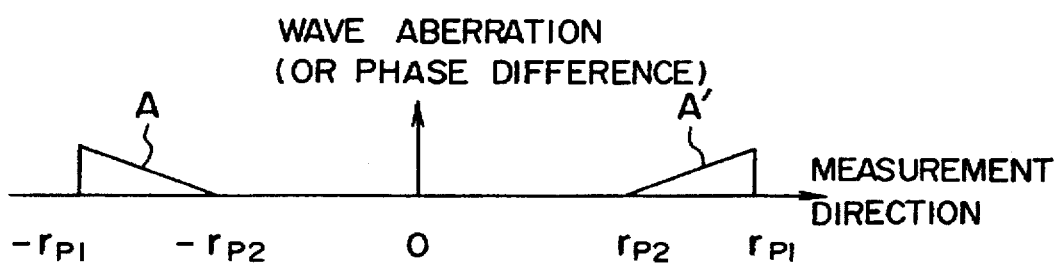
FIG. 32 is a view showing the state of the pair of phase plates (A, A') positioned at the points shown in FIG. 28 and having certain wave aberration (or phase difference) which increases toward the periphery of the pupil.
Figure 33:
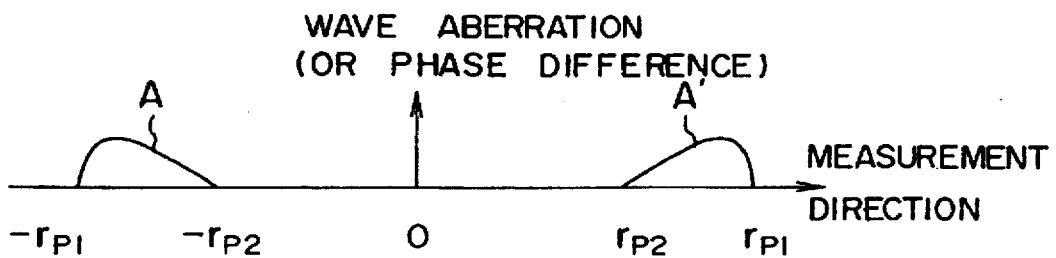
FIG. 33 is a view showing the state of the pair of phase plates (A, A') positioned at the points shown in FIG. 28 and having certain wave aberration (or phase difference) which once increases, and then reduces toward the periphery of the pupil.

As an concrete example, FIG. 28 shows an embodiment where a pair of phase plates (A, A') are placed at points symmetrical about the optical axis AX of the imaging optical system, in or near the pupil surface of the imaging optical system along the direction of measurement, where the section of the pair of phase plates (A, A') along the direction of measurement may have such a structure as shown in FIGS. 31–33.

A pair of phase plates (A, A') shown in FIG. 31 have a structure with certain constant wave aberration (or phase difference) present at points between $-r_{P1}$ and $-r_{P2}$ or at points between $r_{P2}$ and $r_{P1}$ along the direction of measurement.

In addition, a pair of phase plates (A, A') shown in FIG. 32 have a structure with certain wave aberration (or phase difference) which increases at points between $-r_{P1}$ and $-r$ and at points between $r_{P2}$ and $r_{P1}$ along the direction of measurement, as it travels toward the periphery of the pupil.

Further, a pair of phase plates (A, A') shown in FIG. 33 have a structure with certain wave aberration (or phase difference) which increases once as it travels toward the pupil, and then reduces, at points between $-r_{P1}$ and $-r_{P2}$ and at points between $r_{P2}$ and $r_{P1}$ along the direction of measurement, as it travels toward the periphery of the pupil.

As mentioned above, it is understood that a pair of phase plates (A, A') which are placed as shown in FIG. 28 and have a structure as shown in FIG. 31 are constructed to have certain wave aberration along the direction of measurement which is symmetrical about the optical axis AX (origin O) of the imaging optical system along the direction of measurement.

Figure 29:
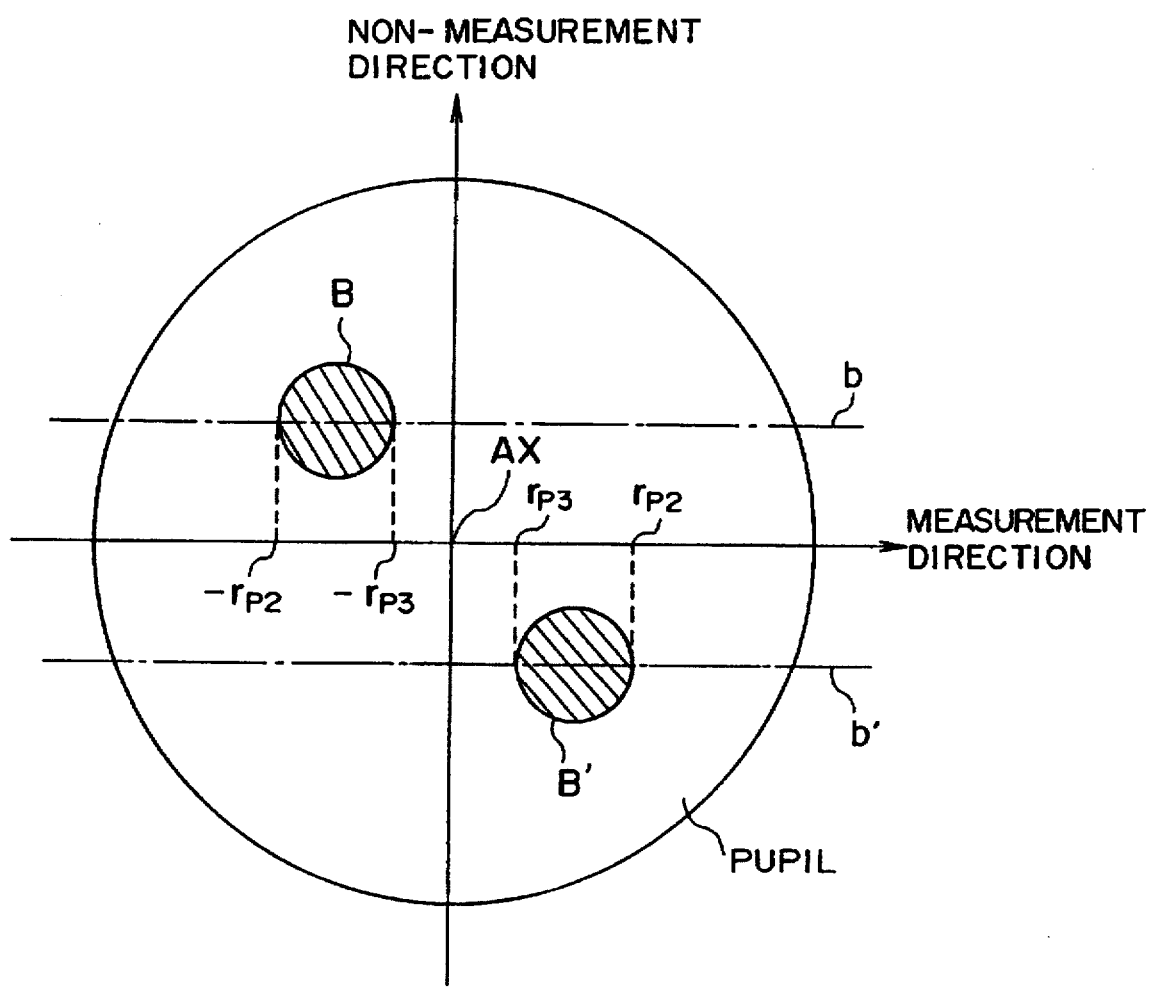
FIG. 29 is a view showing the state of a pair of phase plates (B, B') positioned at points symmetrical about the optical axis AX of an imaging optical system, in the pupil surface of the imaging optical system or its surrounding area.
Figure 34:
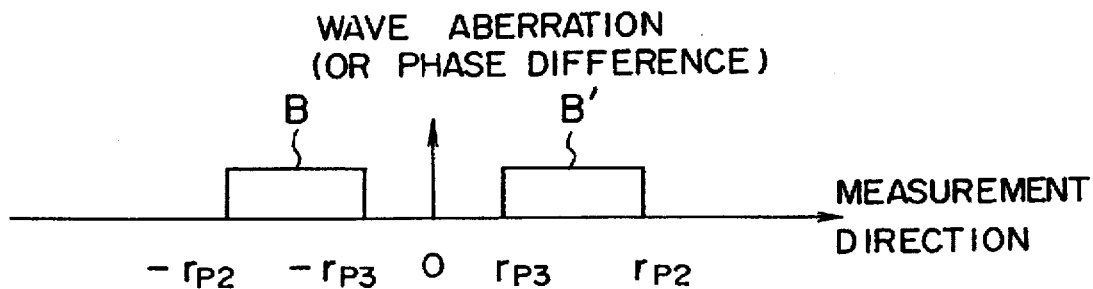
FIG. 34 is a view showing the state of the pair of phase plates (B, B') positioned at the points shown in FIG. 29 and having certain constant wave aberration (or phase difference)
Figure 35:
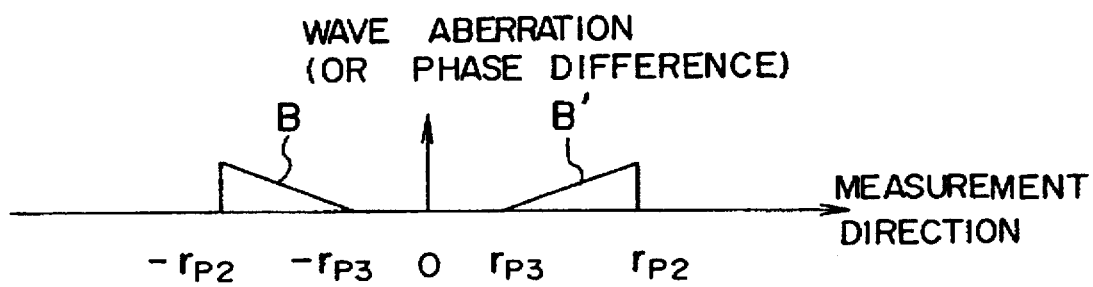
FIG. 35 is a view showing the state of the pair of phase plates (B, B') positioned at the points shown in FIG. 29 and having certain wave aberration (or phase difference) which increases toward the periphery of the pupil.
Figure 36:
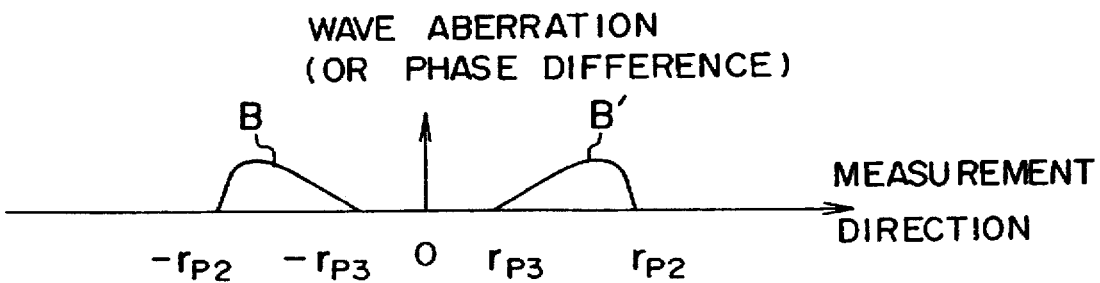
FIG. 36 is a view showing the state of the pair of phase plates (B, B') positioned at the points shown in FIG. 29 and having certain wave aberration (or phase difference) which once increases, and then reduces toward the periphery of the pupil.

Next, FIG. 29 shows an embodiment where a pair of phase plates (B, B') are placed at points symmetrical about the optical axis AX of the imaging optical system, in or near the pupil surface of the imaging optical system, where the section of the pair of phase plates (B, B') along the direction of measurement (b, b') may have such a structure as shown in FIGS. 34–36. However, in FIGS. 34–36, the amount of wave aberration (or the amount of phase difference) to the left of the origin O implies the sectional structure in the b-direction corresponding to the direction of measurement for the other phase plate B, whereas the amount of wave aberration (or the amount of phase difference) to the right of the origin O implies the sectional structure in the b'-direction corresponding to the direction of measurement for the other phase plate B'.

A pair of phase plates (B, B') shown in FIG. 34 have a structure with certain constant wave aberration (or phase difference) present at points between $-r_{P2}$ and $-r_{P3}$ along the b direction corresponding to the direction of measurement or at points between $r_{P3}$ and $r_{P2}$ along the direction of b' corresponding to the direction of measurement.

In addition, a pair of phase plates (B, B') shown in FIG. 35 have a structure with certain wave aberration (or phase difference) which increases at points between $-r_{P2}$ and $-r_{P3}$ along the b direction corresponding to the direction of measurement and at points between $r_{P3}$ and $r_{P2}$ along the direction of b' corresponding to the direction of measurement, as it travels toward the periphery of the pupil.

Further, a pair of phase plates (B, B') shown in FIG. 36 have a structure with certain wave aberration (or phase difference) which once increases, and then reduces as it travels toward the pupil, at points between $-r_{P2}$ and $-r_{P3}$ along the b direction corresponding to the direction of measurement and at points between $r_{P3}$ and $r_{P2}$ along the direction of b' corresponding to the direction of measurement.

As mentioned above, it is understood that a pair of phase plates (B, B') are placed as shown in FIG. 29 and have a structure with certain wave aberration along the direction of measurement which is symmetrical with respect to the origin O, as shown in FIGS. 34–36; in other words, since the position of the origin O in FIGS. 34–36 coincides with the position of the optical axis AX of the imaging optical system, they have a structure with certain wave aberration components (or phase difference components) which are symmetrical about the optical axis AX of the imaging optical system along the direction of measurement.

Figure 30:
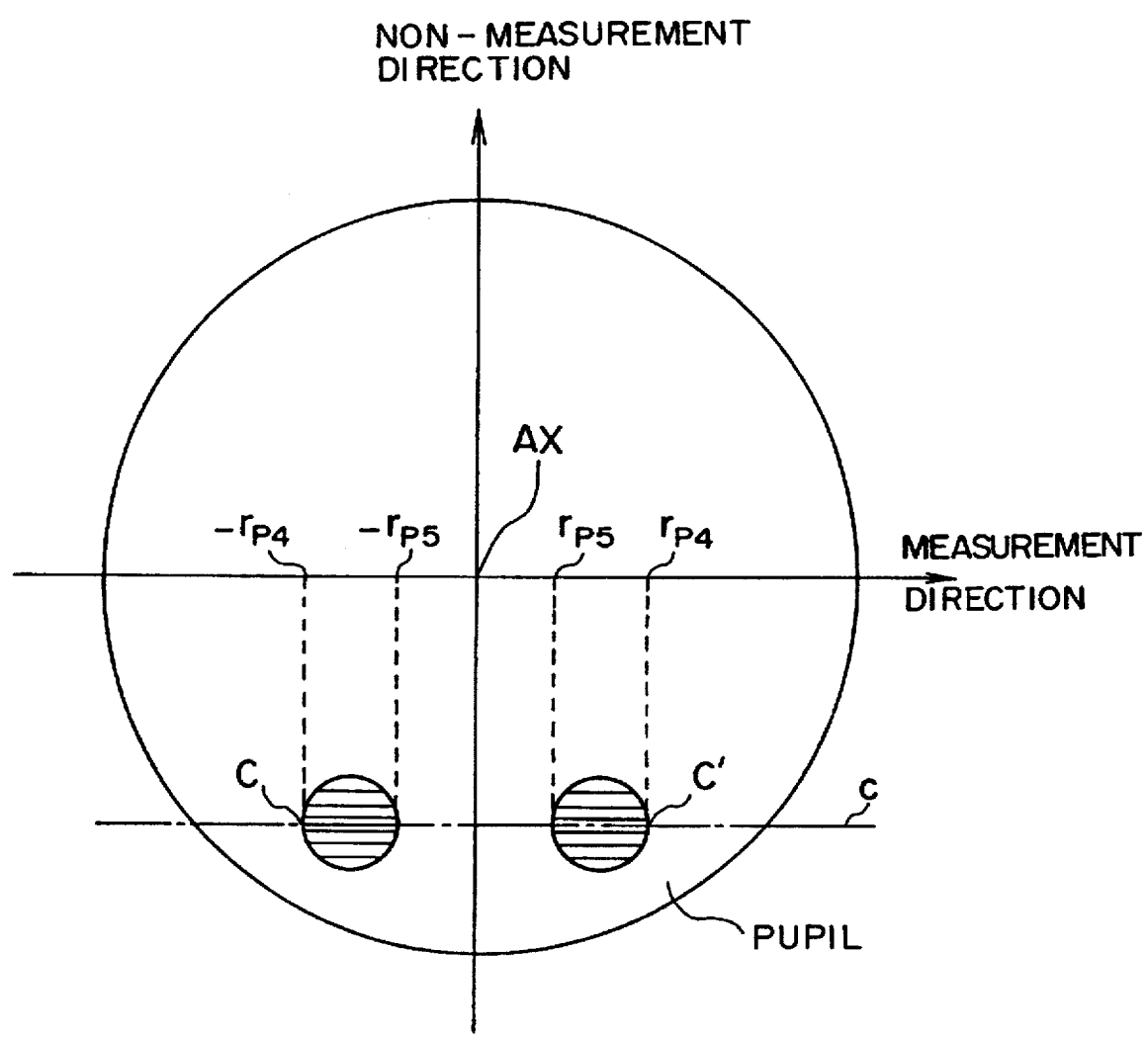
FIG. 30 is a view showing the state of a pair of phase plates (C, C') positioned at points symmetrical with respect to a plane involving the optical axis AX of an imaging optical system, in the pupil surface of the imaging optical system or its surrounding area, in the direction orthogonal to he direction of measurement.
Figure 37:
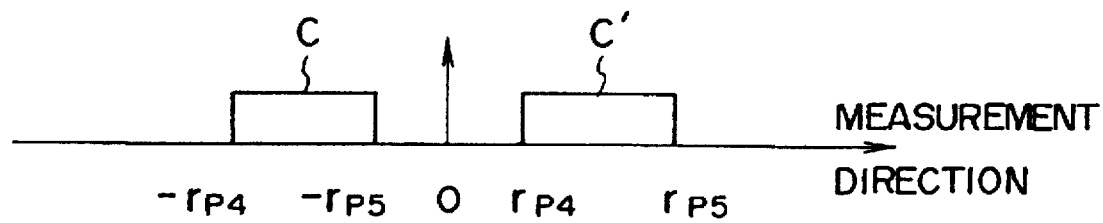
FIG. 37 is a view showing the state of the pair of phase plates (C, C') positioned at the points shown in FIG. 30 and having certain constant wave aberration (or phase difference)
Figure 38:
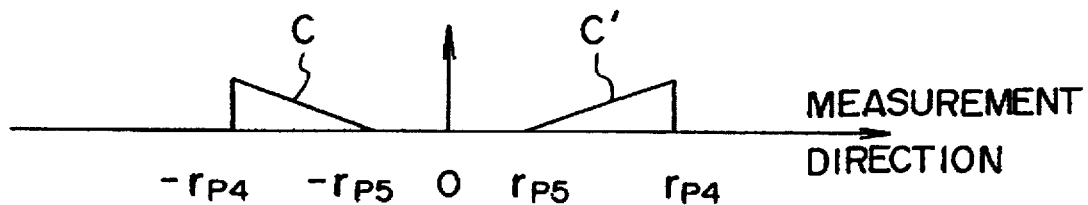
FIG. 38 is a view showing the state of the pair of phase plates (C, C') positioned at the points shown in FIG. 30 and having certain wave aberration (or phase difference) which increases toward the periphery of the pupil.
Figure 39:
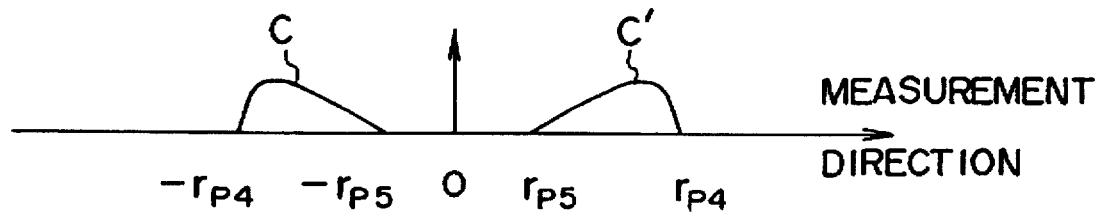
FIG. 39 is a view showing the state of the pair of phase plates (C, C') positioned at the points shown in FIG. 30 and having certain wave aberration (or phase difference) which once increases, and then reduces toward the periphery of the pupil.

Next, FIG. 30 shows an embodiment where a pair of phase plates (C, C') are placed at points symmetrical with a plane which is orthogonal to the direction of measurement and involves the optical axis AX of the imaging optical system, in or near the pupil surface of the imaging optical system, where the section of the pair of phase plates (C, C') in the c direction corresponding to the direction of measurement may have such a structure as shown in FIGS. 37–39.

A pair of phase plates (C, C') shown in FIG. 37 have a structure with certain constant wave aberration (or phase difference) present at points between $-r_{P4}$ and $-r_{P5}$ along the c direction corresponding to the direction of measurement or at points between $r_{P5}$ and $r_{P4}$.

In addition, a pair of phase plates (C, C') shown in FIG. 38 have a structure with certain wave aberration (or phase difference) which increases at points between $-r_{P4}$ and $-r_{P5}$ along the c direction corresponding to the direction of measurement and at points between $r_{P5}$ and $r_{P4}$, as it travels toward the periphery of the pupil.

Further, a pair of phase plates (C, C') shown in FIG. 39 have a structure with certain wave aberration (or phase difference) which once increases, and then reduces as it travels toward the pupil, at points between $-r_{P4}$ and $-r_{P5}$ along the c direction corresponding to the direction of measurement and at points between $r_{P5}$ and $r_{P4}$.

As mentioned above, it is understood that a pair of phase plates (C, C') are placed as shown in FIG. 30 and have a structure with certain wave aberration along the direction of measurement which is symmetrical with respect to the origin O, as shown in FIGS. 37–39; in other words, since the position of the origin O in FIGS. 37–39 coincides with the position of the optical axis AX of the imaging optical system, they have a structure with certain wave aberration components (or phase difference components) which are symmetrical about the optical axis AX of the imaging optical system along the direction of measurement.

As mentioned above, optical members such phase plates as shown in FIG. 28 through FIG. 30 have structures as shown in FIG. 31 through FIG. 39, and accordingly it is understood that beams from the wafer mark WM are provided, in the direction of measurement, with certain wave aberration or wave aberration components which are symmetrical about the optical axis AX of the imaging optical system, and thus the contrast of the image on the image pickup surface may be notably increased in the same manner as the above embodiment which involved defocusing.

Accordingly, as is readily apparently, the wave aberration-providing means according to the present invention includes optical members such phase plates placed as shown in FIG. 28 through FIG. 30 and constructed as shown in FIG. 31 through FIG. 39.

In addition, the present invention may be applied not only to reflection type illumination, but transparent type illumination.

Furthermore, the above embodiment is an example of application of the present invention to an off-axis type alignment system or microscope, and the present invention may also be applied to TTL (through-the-lens) type alignment systems which detects positions via a projection optical system PL as shown in FIG. 3, and to TTR (through-the-reticle) type alignment systems to detect low level marks.

In conclusion, without being limited to the above embodiment, the present invention may be constructed in a variety of ways without departing from the spirit of the present invention.

According to the present invention, since beams from the mark for positional detection are provided with wave aberration in the direction of measurement, which is symmetrical about the optical axis of the imaging optical system, the contrast of the image formed on the image pickup surface is increased. Therefore, the present invention is advantageous in that the position of an image of a low level mark for positional detection which was not detectable previously may be detected with high precision.

Further, in cases the wave aberration-providing means is defocusing means for defocusing the image of the mark for positional detection, there is an advantage in that desired rotation-symmetrical wave aberration may be provided readily simply by moving the object to be detected on which the mark for positional detection is formed, image pickup means or the like.

Furthermore, when the wave aberration-providing means is an optical member which is positioned near the pupil surface of the imaging optical system and provides the imaging beams passing through different areas of the pupil surface with certain phase difference, there is an additional advantage that not only wave aberration which is rotation-symmetrical about the optical axis of the imaging optical system, but certain wave aberration or wave aberration components which are symmetrical about the imaging optical systems are provided.

In addition, when the present invention is constructed so that illumination σ value varies by σ value-varying means, in response to the amount of variable wave aberration given to the beams to be detected from the mark for positional detection by wave aberration-providing means, then the contrast of the image picked up by the image pickup means may be increased, and thus the detection of positions of even very low level marks may be performed with high precision.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.323514/1993 filed on Dec. 22, 1993 is hereby incorporated by reference.

What is claimed is:

1. A position detecting apparatus comprising:

an illumination optical system for illuminating a mark for positional detection, the mark being formed on an object to be detected;

an imaging optical system for converging light from said mark for positional detection to form an image of said mark for positional detection;

a wave aberration-providing unit for providing the light with a wave aberration along a direction of measurement, the wave aberration being symmetrical for an optical axis of said imaging optical system;

an image pickup unit for picking up an image of said mark for positional detection; and a σ value-varying unit arranged on an optical path from a light source of said illumination optical system to an imaging surface of said imaging optical system and varies a illumination σ value defined as the ratio of the numerical aperture of said illumination optical system and the numerical aperture of said imaging optical system, said wave aberration-providing unit being capable of varying the wave aberration to be provided to light to be detected from said mark for positional detection, said σ value-varying unit varying said illumination σ value corresponding to the amount of the wave aberration provided by said wave-aberration unit, whereby said position detecting apparatus analyzes image pickup signals from said image pickup unit, detects an amount of displacement of said mark for positional detection on said object to be detected toward said direction of measurement, and detects a position of said object to be detected based on the amount of displacement.

2. A position detecting apparatus according to claim 1, wherein said wave aberration-providing unit defocuses the image of said mark for positional detection.

3. A position detection apparatus according to claim 2, wherein said wave aberration-providing unit comprises a stage for supporting said object on which said mark for position detection is formed and movably provided along said optical axis of said imaging optical system to defocus said mark image.

4. A position detecting apparatus according to claim 1, wherein said wave aberration-providing unit is an optical member in and near the pupil surface of said imaging optical system and provides the light passing through said pupil surface with phase difference corresponding to a passing position.

5. A position detection apparatus according to claim 1, wherein said wave aberration-providing unit comprises an optical member constituting a part of said imaging optical system and said optical member is provided movably in a predetermined direction to provide a light passing therethrough with a predetermined amount of the wave aberration which is symmetrical for the optical axis of said imaging optical system.

6. A position detection apparatus according to claim 1, wherein said wave aberration-providing unit is provided insertably to an imaging light flux of said imaging optical system and said wave aberration-providing unit comprises an optical member for providing a light passing therethrough with phase differences corresponding to passing position of said imaging light flux in said optical member.

7. A position detecting apparatus comprising:
an illumination optical system for illuminating a mark for positional detection, the mark being formed on an object to be detected;
an imaging system for converging light from said mark for positional detection to form an image of said mark for positional detection, said imaging system comprising a wave aberration-providing unit for providing the light with a wave aberration along a direction of measurement, the wave aberration being symmetrical for an optical axis, said wave aberration-providing unit being an optical member in and near the pupil surface of said imaging optical system and provides the light passing through said pupil surface with phase difference corresponding to a passing position; and
an image pickup unit for picking up an image of said mark for positional detection,
whereby said position detecting apparatus analyzes image pickup signals from said image pickup unit, detects an amount of displacement of said mark for positional detection on said object to be detected toward said direction of measurement, and detects a position of said object to be detected based on the amount of displacement.

8. A position detecting apparatus comprising:
an illumination optical system for illuminating a mark for positional detection, the mark being formed on an object to be detected;
an imaging optical system for converging light from said mark for positional detection to form an image of said mark for positional detection;
a wave aberration-providing means for providing the light with a wave aberration along a detection of measurement, the wave aberration being symmetrical of an optical axis of said imaging optical system;
an image pickup means for picking up and image of said mark for positional detection; and
a σ value-varying means arranged on an optical path from a light source of said illumination optical system to an imaging surface of said imaging optical system and varies a illumination a value defined as the ratio of the numerical aperture of said illumination optical system and the numerical aperture of said imaging optical system, said wave aberration-providing means being capable of varying the wave aberration to be provided to light to be detected from said mark for positional detection, said σ value-varying means varying said illumination σ value corresponding to the amount of the wave aberration provided by said wave-aberration means,
whereby said position detecting apparatus analyzes image pickup signals from said image pickup means, detects an amount of displacement of said mark for positional detection on said object to be detected toward said direction of measurement, and detects a position of said object to be detected based on the amount of displacement.

9. A position detecting apparatus comprising:
an illumination optical system for illuminating a mark for positional detection, the mark being formed on an object to be detected;
an imaging optical system for converging light from said mark for positional detection to form an image of said mark for positional detection, said imaging optical system comprising a wave aberration-providing means for providing the light with a wave aberration along a direction of measurement, the wave aberration being symmetrical for an optical axis, said wave aberration-providing unit being an optical member in and near the pupil surface of said imaging optical system and provides the light passing through said pupil surface with phase difference corresponding to a passing position; and
an image pickup means for picking up an image of said mark for positional detection,
whereby said position detecting apparatus analyzes image pickup signals from said image pickup means, detects an amount of displacement of said mark for positional detection on said object to be detected toward said direction of measurement, and detects a position of said object to be detected based on the amount of displacement.

10. An exposure apparatus comprising:
a position detecting apparatus for detecting the position of a photosensitive substrate to be exposed; and
an exposure apparatus for adjusting a position of said photosensitive substrate based on the position detected by said position detection apparatus and exposing said photosensitive substrate,
wherein said position detection apparatus comprising:
an illumination optical system for illuminating a mark for positional detection, the mark being formed on an object to be detected;
an imaging optical system for converging light from said mark for positional detection to form an image of said mark for positional detection;
a wave aberration-providing unit for providing the light with a wave aberration along a direction of measurement, the wave aberration being symmetrical for an optical axis of said imaging optical system;
an image pickup unit for picking up an image of said mark for positional detection; and
a σ value-varying unit arranged on an optical path from a light source of said illumination optical system to an imaging surface of said imaging optical system and varies a illumination σ value defined as the ratio of the numerical aperture of said illumination optical system and the numerical aperture of said imaging optical system, said wave aberration-providing unit being capable of varying the wave aberration to be provided to light to be detected from said mark for positional detection, said σ value-varying unit varying said illumination σ value corresponding to the amount of the wave aberration provided by said wave-aberration unit, whereby said position detecting apparatus analyzes image pickup signals from said image pickup unit, detects an amount of displacement of said mark for positional detection on said object to be detected toward said direction of measurement, and detects a position of said object to be detected based on the amount of displacement.

11. A projection exposure apparatus according to claim 10, wherein said wave aberration-providing unit defocuses the image of said mark for positional detection.

12. A projection exposure apparatus according to claim 10, wherein said wave aberration-providing unit is an optical member in and near the pupil surface of said imaging optical system and provides the light passing through said pupil surface with phase difference corresponding to a passing position.

13. An exposure apparatus according to claim 10, wherein said wave aberration-providing unit comprises a stage for supporting said photosensitive substrate on which the mark for position detection is formed and movably provided along said axis of said imaging optical system.

14. An exposure apparatus according to claim 10, wherein said wave aberration-providing unit comprises an optical member constituting a part of said imaging optical system and said optical member is provided movably in a predetermined direction to provide a light passing therethrough with a predetermined amount of the wave aberration which is symmetrical for the optical axis of said imaging optical system.

15. An exposure apparatus according to claim 10, wherein said wave aberration-providing unit is provided insertably to an imaging light flux of said imaging optical system and said wave aberration-providing unit comprises an optical member for providing a light passing therethrough with phase differences corresponding to passing position of said imaging light flux in said optical member.

16. An exposure apparatus according to claim 15, further comprising:

an input unit for entering information regarding to said mark for position detection;

a first driving device for setting said optical member to be insertable to the imaging light flux of said imaging optical system;

a second driving device for varying the σ of said σ value-varying unit; and a control unit for respectively controlling said first and second driving devices on the basis of an input signal output from said input unit.

17. An exposure apparatus according to claim 10, further comprising:

an input unit for entering information regarding to said mark for position detection;

a first driving device for moving said wave aberration-providing unit in a predetermined direction to vary the amount of the wave aberration which is symmetrical to the optical axis of said imaging optical system;

a second driving device for varying the σ of said σ value-varying unit; and a control unit in response to an input signal output from said input unit for respectively calculating driving amounts of said first and second driving devices to respectively control said first and second driving devices on the basis of the calculated results.

18. A projection exposure apparatus comprising:

a position detecting apparatus for detecting the position of a wafer to be exposed; and an exposure apparatus for adjusting a position of said wafer based on the position detected by said position detection apparatus and exposing said wafer, wherein said position detection apparatus comprising:

an illumination optical system for illuminating a mark for positional detection, the mark being formed on an object to be detected;

an imaging optical system for converging light from said mark for positional detection to form an image of said mark for positional detection, said imaging optical system comprising a wave aberration-providing unit for providing the light with a wave aberration along a direction of measurement, the wave aberration being symmetrical for an optical axis, said wave aberration-providing unit being an optical member in and near the pupil surface of said imaging optical system and provides the light passing through said pupil surface with phase difference corresponding to a passing position; and an image pickup unit for picking up an image of said mark for positional detection, whereby said position detecting apparatus analyzes image pickup signals from said image pickup unit, detects an amount of displacement of said mark for positional detection on said object to be detected toward said direction of measurement, and detects a position of said object to be detected based on the amount of displacement.

* * * * *

UNITED STATES PATENT AND TRADEMARK OFFICE
CERTIFICATE OF CORRECTION

PATENT NO. : 5,684,569
DATED : November 4, 1997
INVENTOR(S) : Ayako Sugaya, Masahiro Nakagawa It is certified that error appears in the above-identified patent and that said Letters Patent is hereby corrected as shown below:

On the title page: Item [30] Foreign Application Priority Data, change "5-3233514" to --5-323514--.

Signed and Sealed this

Third Day of February, 1998

BRUCE LEHMAN

Attest:

Attesting Officer

Commissioner of Patents and Trademarks